(12) United States Patent
Omori

(10) Patent No.: US 9,553,060 B2
(45) Date of Patent: Jan. 24, 2017

(54) SEMICONDUCTOR DEVICE AND MANUFACTURING METHOD THEREFOR

(71) Applicant: RENESAS ELECTRONICS CORPORATION, Tokyo (JP)

(72) Inventor: Kazuyuki Omori, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/072,148

(22) Filed: Mar. 16, 2016

(65) Prior Publication Data
US 2016/0300804 A1    Oct. 13, 2016

(30) Foreign Application Priority Data
Apr. 10, 2015   (JP) .................................. 2015-080779

(51) Int. Cl.
| H01L 21/76 | (2006.01) |
| H01L 23/00 | (2006.01) |
| H01L 23/31 | (2006.01) |
| H01L 23/29 | (2006.01) |
| H01L 21/768 | (2006.01) |

(52) U.S. Cl.
CPC ........... *H01L 24/05* (2013.01); *H01L 21/7685* (2013.01); *H01L 21/76865* (2013.01); *H01L 23/293* (2013.01); *H01L 23/3171* (2013.01); *H01L 24/03* (2013.01); *H01L 2224/02373* (2013.01); *H01L 2224/05144* (2013.01); *H01L 2224/05623* (2013.01); *H01L 2224/05624* (2013.01); *H01L 2224/05664* (2013.01); *H01L 2224/05666* (2013.01); *H01L 2224/05671* (2013.01); *H01L 2924/01029* (2013.01)

(58) Field of Classification Search
CPC ............. H01L 23/532; H01L 23/53238; H01L 23/53223; H01L 21/76; H01L 21/768; H01L 21/76843; H01L 21/76846; H01L 21/76877
USPC ......................................... 438/106; 257/751
See application file for complete search history.

(56) References Cited

U.S. PATENT DOCUMENTS

2004/0053444 A1*  3/2004  Yoneda ................... H01L 23/36
                                                              438/106

FOREIGN PATENT DOCUMENTS

JP        2012-204495 A      10/2012

* cited by examiner

*Primary Examiner* — Monica D Harrison
(74) *Attorney, Agent, or Firm* — McDermott Will & Emery LLP

(57) ABSTRACT

Provided are a semiconductor device and a manufacturing method therefor that can prevent electric short-circuiting between redistribution lines. A barrier film is formed over each side surface of a copper redistribution line. The barrier film includes, for example, a manganese oxide film. The barrier film is also in contact with each end surface of a barrier metal film that is located in the position receding inward from the side surface of the copper redistribution line. A redistribution portion is formed by the copper redistribution line, the barrier film, and the barrier metal film.

17 Claims, 21 Drawing Sheets

| | HIGH BIAS CONDITION | LOW BIAS CONDITION |
|---|---|---|
| ENERGY OF COPPER IONS INCIDENT ONTO SUBSTRATE | HIGH | LOW |
| RE-SPUTTERING AMOUNT ON SUBSTRATE | MUCH | LITTLE |
| ANGLE OF PARTICLES RE-SPUTTERED | LOW ANGLE TO HIGH ANGLE | LOW ANGLE |

SEMICONDUCTOR DEVICE AND MANUFACTURING METHOD THEREFOR

CROSS-REFERENCE TO RELATED APPLICATIONS

The disclosure of Japanese Patent Application No. 2015-080779 filed on Apr. 10, 2015 including the specification, drawings and abstract is incorporated herein by reference in its entirety.

BACKGROUND

The present invention relates to semiconductor devices and manufacturing methods therefor, and more particularly, to a technique suitable for use in a semiconductor device including copper redistribution lines.

To address the downsizing of electronic devices and the like, wafer-level chip-scale packaging technology has been increasingly developed in the field of semiconductor devices. Wafer-level chip-scale packaging is a technology that involves performing a series of processes for forming elements, the wiring, and the like over a semiconductor substrate (wafer), followed by forming a passivation film, and then forming more wiring, electrodes (pads), and the like over the passivation film.

The wiring formed over the passivation film is referred to as a redistribution line. The size of the redistribution line is approximately an order of magnitude larger than that of a normal wiring formed under the passivation film. A material suitable for use in the redistribution line is copper, which has a relatively low electric resistivity (specific resistance) and a high thermal conductivity.

A bonding pad for bonding a copper wire is formed at the surface of the redistribution line. As the bonding pad, a gold (Au) film or the like is formed. Such a structure that has the bonding pad including the gold film in the redistribution line is called a "redistribution layer with Au pad (RAP) structure".

After forming the bonding pads, a polyimide film is formed to cover the redistribution lines, the bonding pads, and the like. The polyimide film is provided with an opening for exposing each bonding pad. Thereafter, the wafer is diced into chips. A copper wire is bonded to the bonding pad of a semiconductor device of the chip, and then the semiconductor device (chip) is sealed (packaged). Note that Patent Document 1 is an example of a document that discloses a general copper wiring.

RELATED ART DOCUMENTS

Patent Documents

[Patent Document 1] Japanese Unexamined Patent Application Publication No. 2012-204495

SUMMARY

Semiconductor devices are subjected to an environmental test, which is called a "highly accelerated temperature and humidity stress test (HAST)" as one of the reliability assessments. In the environmental test, while the semiconductor device is exposed to the environment at a high temperature and high humidity, a relatively high voltage, for example, of about several tens of V to about 100 V is applied to redistribution lines made of copper. The inventors have confirmed that at this time, copper precipitates between the redistribution lines, causing the phenomenon of electric short-circuiting therebetween.

Other problems and new features of the present invention will be clarified from the description of the present specification and the accompanying drawings.

A semiconductor device according to one embodiment includes a semiconductor substrate, a multi-layer wiring, a passivation film, a redistribution portion, a pad portion, and a resin film. The passivation film is formed to cover an uppermost-layer wiring disposed in the highest position in the multi-layer wiring, and has an opening communicating with the uppermost-layer wiring. The redistribution portion includes a redistribution line that is formed to be in contact with a part of the uppermost-layer wiring positioned in the opening, and has side surfaces and an upper surface. The pad portion is formed to be in contact with the upper surface of the redistribution line. The redistribution portion includes a barrier film formed to be in contact with the side surface of the redistribution line and containing a metal oxide film. The pad portion includes a pad metal film made of material different from that for the barrier film.

A method for manufacturing a semiconductor device according to another embodiment includes the steps of forming a multi-layer wiring; forming a passivation film; forming a redistribution portion; and forming a pad portion. In the step of forming the redistribution portion, the redistribution portion that includes a redistribution line with side surfaces and an upper surface is formed to be in contact with the uppermost-layer wiring exposed from the opening. A metal film containing at least first metal is formed at the side surface of the redistribution line except for the surface of the passivation film and the upper surface of the redistribution line. A barrier film is formed to contain a first metal oxide film formed by oxidization of the first metal by applying heat treatment to the metal film. In forming the pad film, a pad metal film is formed of material different from that for the barrier film.

Accordingly, the semiconductor device in the one embodiment can prevent electric short-circuiting between the redistribution lines by the barrier film.

Further, the method for manufacturing a semiconductor device in another embodiment forms the barrier films at the side surfaces of the redistribution line, thereby producing the semiconductor device that can prevent electric short-circuiting between the redistribution lines.

DETAILED DESCRIPTION

First Embodiment

Hereinafter, a description will be given of an example of a semiconductor device including a copper redistribution line and a bonding pad that are respectively formed by an electrolytic plating method.

Figure 1:
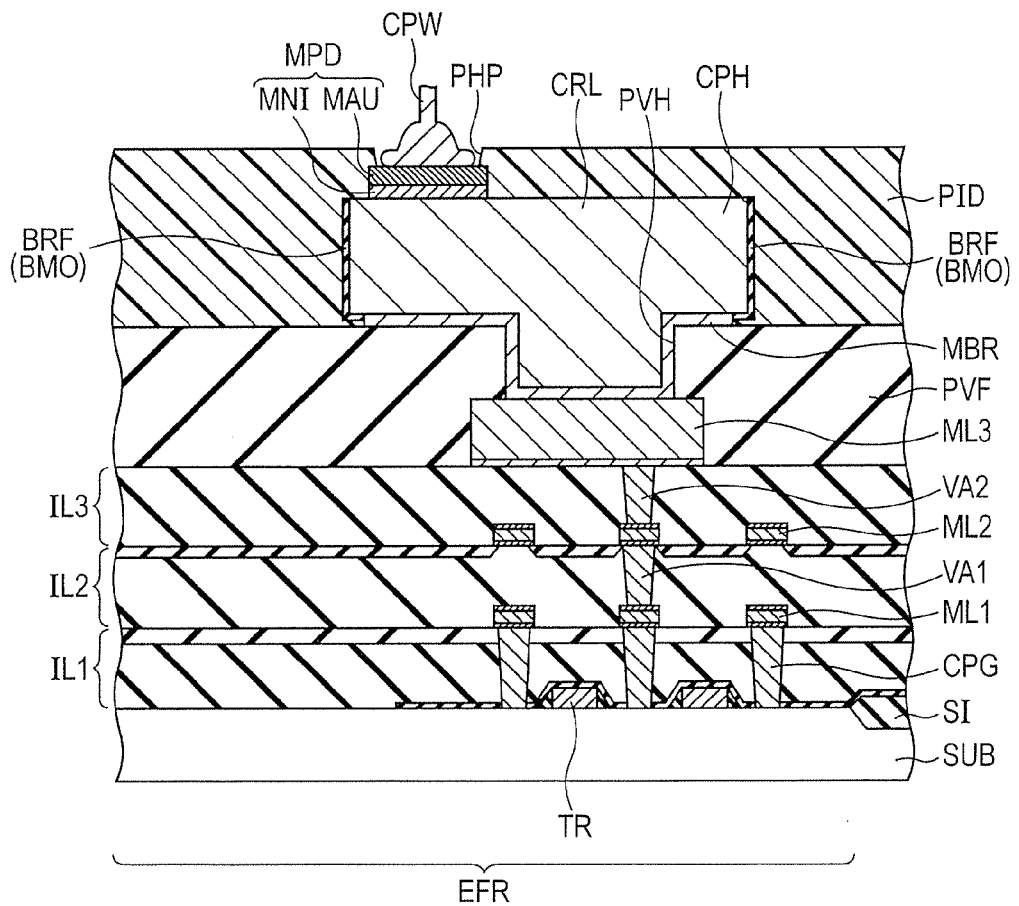
FIG. 1 is a cross-sectional view of a semiconductor device according to a first embodiment.

As shown in FIG. 1, an element formation region EFR is defined by an element isolation insulating film SI formed in a predetermined region at the main surface of a semiconductor substrate SUB. A transistor TR is formed as one type of semiconductor element in the element formation region EFR. An interlayer insulating film IL1 is formed to cover the transistors TR. Contact plugs CPG are formed to pass through the interlayer insulating film IL1.

First wirings ML1 are formed, for example, of an aluminum film, over the surface of the interlayer insulating film IL1. The first wiring ML1 is electrically coupled to the transistor TR via the corresponding contact plug CPG. An interlayer insulating film IL2 is formed to cover the first wirings ML1. Vias VA1 are formed to pass through the interlayer insulating film IL2. Second wirings ML2 are formed, for example, of an aluminum film, over the surface of the interlayer insulating film IL2. Each second wiring ML2 is electrically coupled to the corresponding first wiring ML1 through the via VA1.

An interlayer insulating film IL3 is formed to cover the second wirings ML2. Vias VA2 are formed to pass through the interlayer insulating film IL3. Third wirings ML3 are formed, for example, of an aluminum film, over the surface of the interlayer insulating film IL3. The third wirings ML3 serve as pads and are electrically coupled to the second wirings ML2 through the vias VA2. In the semiconductor device, the third wirings ML3 are positioned at the uppermost layer of a multi-layer wiring.

A passivation film PVF is formed of a silicon nitride film to cover the third wiring ML3. The passivation film PVF is provided with an opening PVH communicating with the third wiring ML3. A barrier metal film MBR is formed to be in contact with the passivation film PVF and a part of the third wiring ML3 positioned at the bottom of the opening PVH.

A copper redistribution line CPH is formed to be in contact with the barrier metal film MBR. The size of the redistribution line CPH is approximately an order of magnitude larger than that of each of the normal first to third wirings ML1 to ML3 formed under the passivation film PVF. For example, the redistribution line CPH has a thickness of approximately several μm and a width of approximately 10 μm.

The copper redistribution line CPH is formed by the electrolytic plating method as will be described later. The barrier metal film MBR is formed of, for example, a chromium (Cr) film, a titanium (Ti) film, or the like. Each of the end surfaces of the barrier metal film MBR is located in a position receding inward (toward the opening PVH) from the side surface of the copper redistribution line CPH by side-etching.

A barrier film BRF is formed over each side surface of the copper redistribution line CPH. The barrier film BRF contains, for example, a manganese oxide film BMO. The barrier film BRF is also in contact with the end surface of the barrier metal film MBR that is located in the position receding inward from the side surface of the copper redistribution line CPH. A redistribution portion CRL is formed of the copper redistribution line CPH, the barrier films BRF, and the barrier metal film MBR.

A pad portion MPD is formed to be in contact with an upper surface of the copper redistribution line CPH. The pad portion MPD is formed of a nickel film MNI and a gold film MAU. The gold film MAU (pad metal film) is formed over the nickel film MNI. A polyimide film PID is formed to cover the redistribution portion CRL. An opening PHP for exposing the pad portion MPD is formed in the polyimide film PID. A copper wire CPW is bonded to the pad portion MPD (gold film MAU) positioned at the bottom of the opening PHP. Main parts of the semiconductor device in this embodiment are configured as mentioned above.

Next, a method for manufacturing the above-mentioned semiconductor device will be described by way of example. First, the element isolation insulating film SI is formed in the region of the semiconductor substrate SUB by a general manufacturing method, thereby forming an element formation region, and then the transistor TR is formed in the element formation region (see FIG. 1). A multi-layer wiring structure including the first to third wirings ML1 to ML3 is formed to cover the transistors TR and the like (see FIG. 1).

Figure 2:
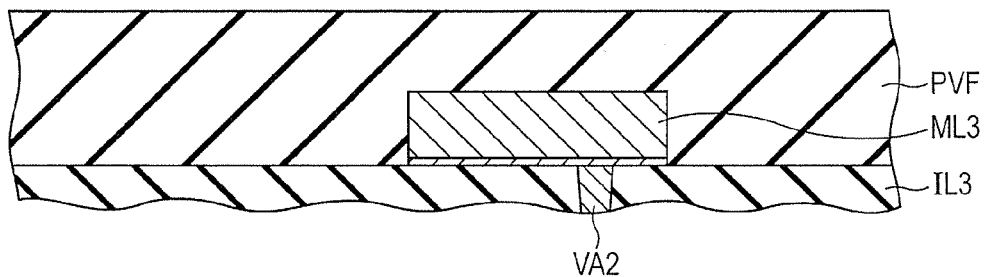
FIG. 2 is a partial cross-sectional view showing one step in a manufacturing method for the semiconductor device shown in FIG. 1 in the first embodiment.
Figure 3:
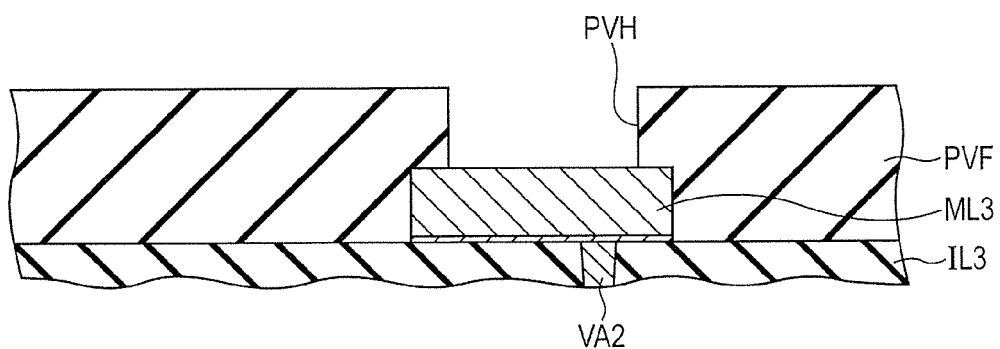
FIG. 3 is a partial cross-sectional view showing another step performed after the step shown in FIG. 2 in the first embodiment.
Figure 4:
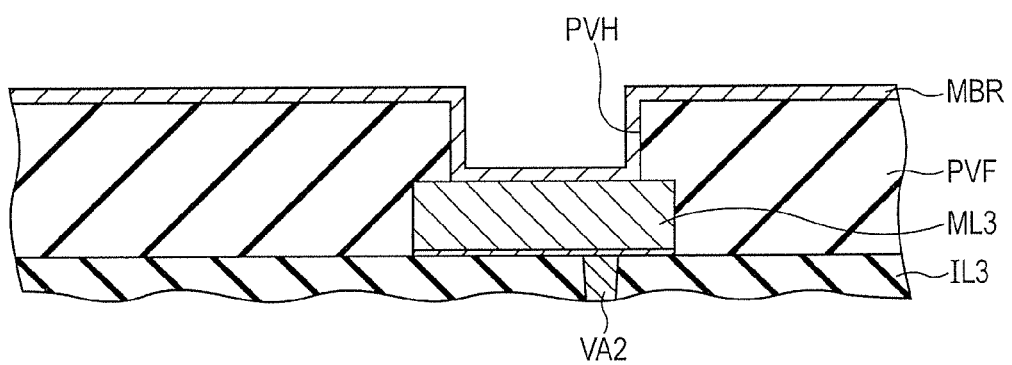
FIG. 4 is a partial cross-sectional view showing another step performed after the step shown in FIG. 3 in the first embodiment.

Then, as shown in FIG. 2, the passivation film PVF is formed of a silicon nitride film, for example, by a chemical vapor deposition (CVD) method, to cover the third wiring ML3 positioned at the uppermost layer. Subsequently, as shown in FIG. 3, the opening PVH is formed to expose the third wiring ML3 by a photoengraving process and an etching process. Then, as shown in FIG. 4, the barrier metal film MBR, such as a chromium (Cr) film or a titanium (Ti) film, is formed by sputtering or the like to be in contact with the passivation film PVF and the part of the third wiring ML3 positioned at the bottom of the opening PVH.

Figure 5:
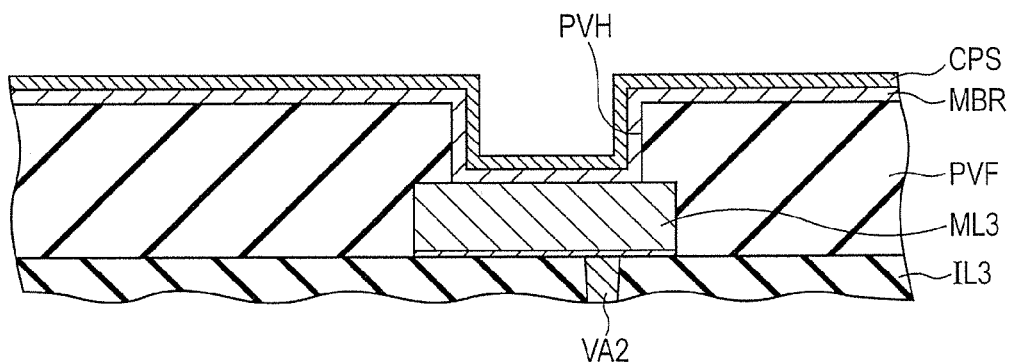
FIG. 5 is a partial cross-sectional view showing another step performed after the step shown in FIG. 4 in the first embodiment.
Figure 6:
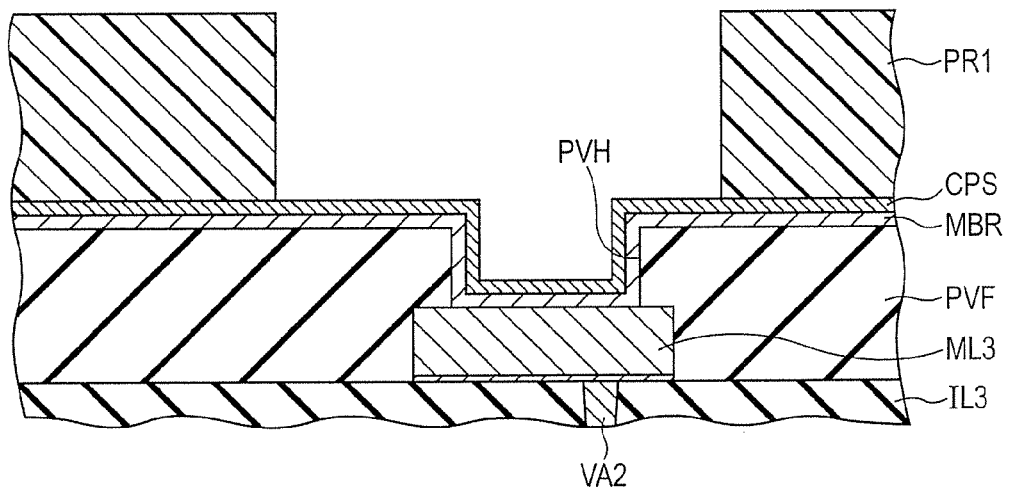
FIG. 6 is a partial cross-sectional view showing another step performed after the step shown in FIG. 5 in the first embodiment.
Figure 7:
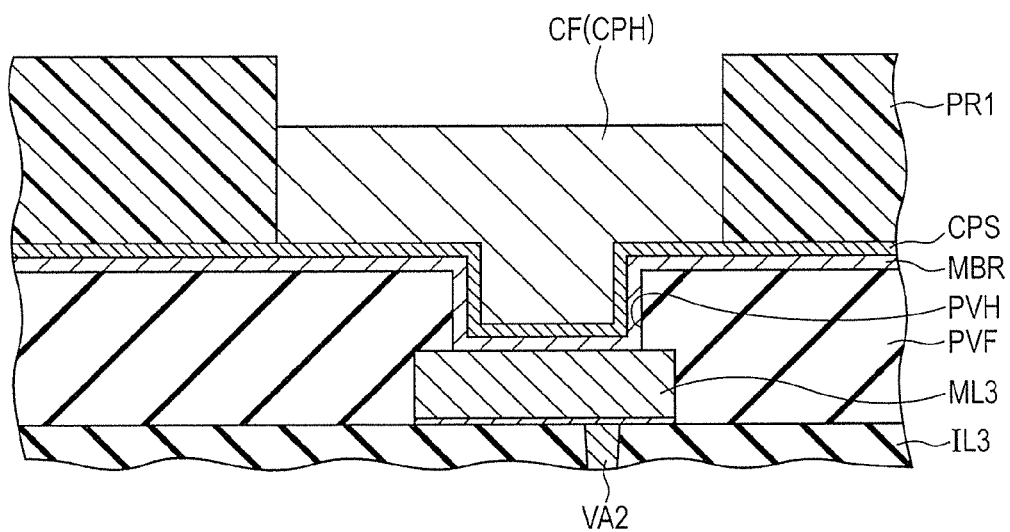
FIG. 7 is a partial cross-sectional view showing another step performed after the step shown in FIG. 6 in the first embodiment.

Thereafter, as shown in FIG. 5, a copper seed film CPS is formed to be in contact with the barrier metal film MBR by sputtering or the like. Then, as shown in FIG. 6, a photoresist pattern PR1 is formed to expose a region where the redistribution line is to be formed by the photoengraving process and to cover remaining other regions. Subsequently, as shown in FIG. 7, a copper plated film CF is formed over the exposed surface of the copper seed film CPS by the electrolytic plating method using the copper seed film CPS as an electrode. The copper plated film CF becomes the copper redistribution line CPH. Thereafter, the photoresist pattern PR1 is removed.

Figure 8:
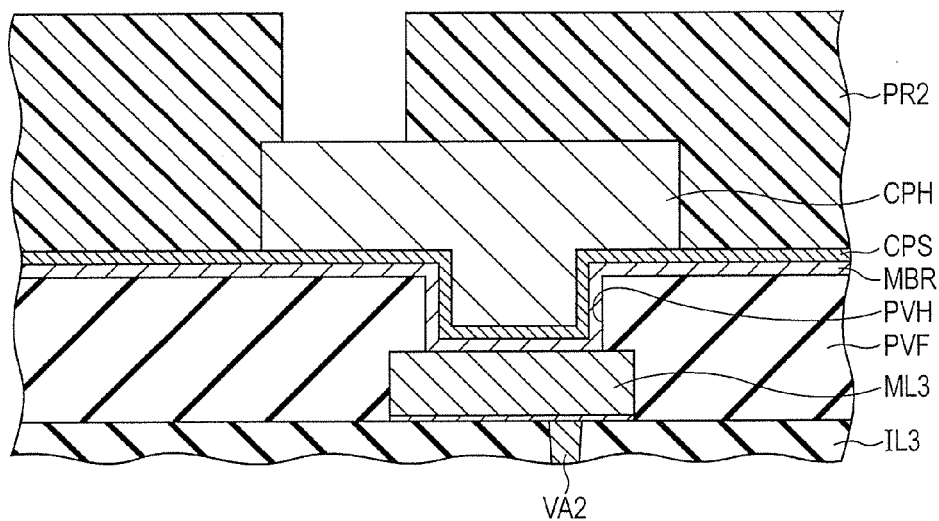
FIG. 8 is a partial cross-sectional view showing another step performed after the step shown in FIG. 7 in the first embodiment.
Figure 9:
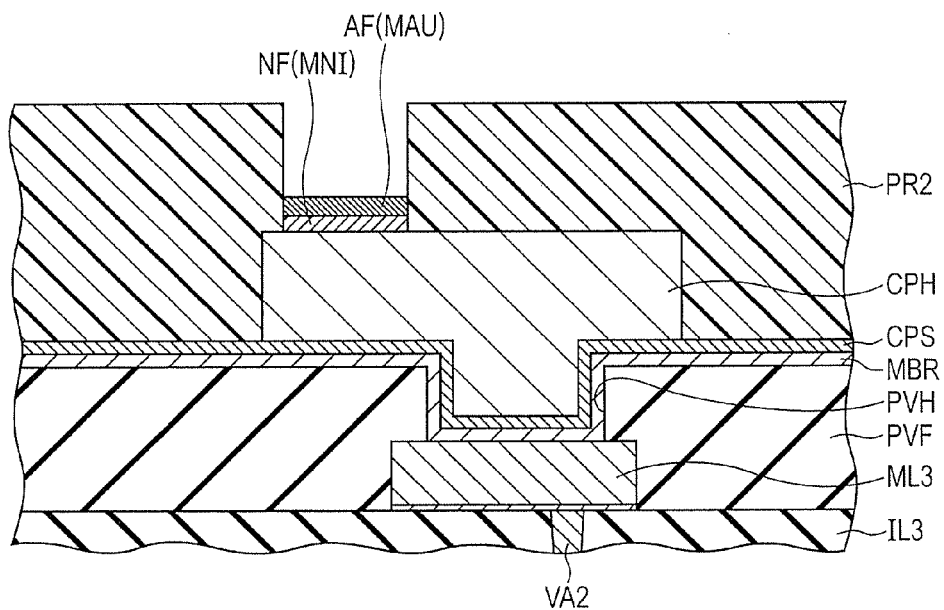
FIG. 9 is a partial cross-sectional view showing another step performed after the step shown in FIG. 8 in the first embodiment.
Figure 10:
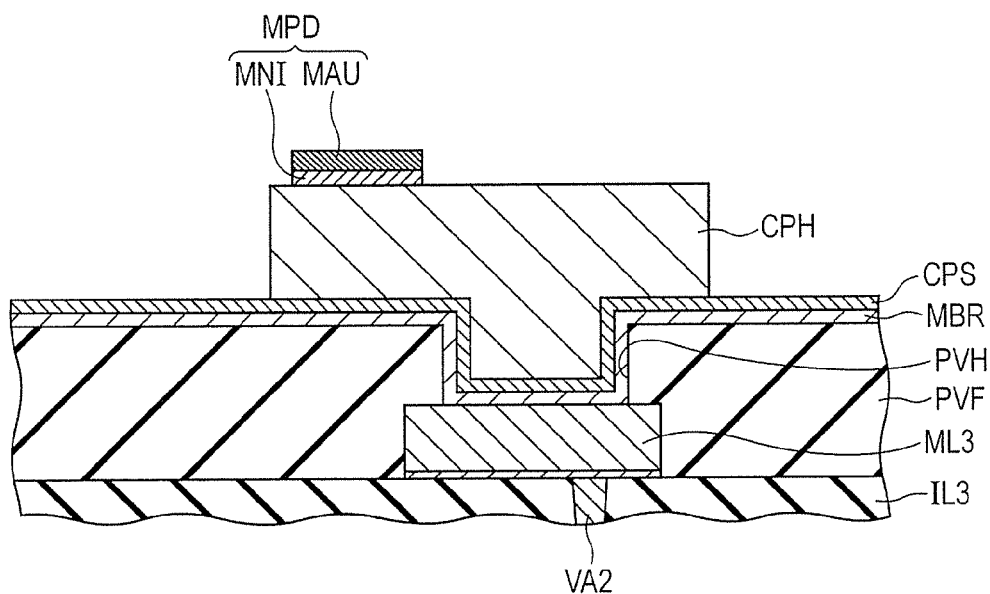
FIG. 10 is a partial cross-sectional view showing another step performed after the step shown in FIG. 9 in the first embodiment.

Then, as shown in FIG. 8, a photoresist pattern PR2 is formed to expose a part of the copper redistribution line CPH where the pad portion is to be formed by the photoengraving process and to cover remaining other regions. Then, as shown in FIG. 9, a nickel plated film NF is formed over the exposed surface (upper surface) of the copper redistribution line CPH by the electrolytic plating method. Further, a gold plated film AF is formed over the surface of the nickel plated film NF by the electrolytic plating method. Here, the nickel plated film NF becomes a nickel (Ni) film MNI of the pad portion, and the gold plated film AF becomes a gold (Au) film MAU of the pad portion. Thereafter, as shown in FIG. 10, the copper redistribution line CPH and the like formed on the surface of the copper seed film CPS is exposed by removing the photoresist pattern PR2.

Figure 11:
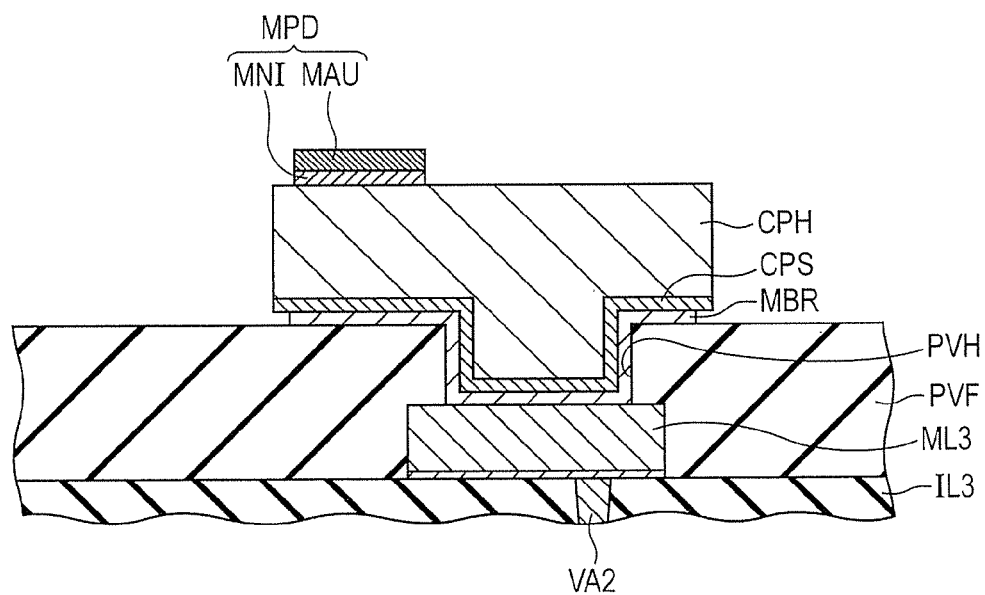
FIG. 11 is a partial cross-sectional view showing another step performed after the step shown in FIG. 10 in the first embodiment.

Then, exposed parts of the copper seed film CPS are removed by wet etching with chemical to thereby expose the barrier metal film MBR. Subsequently, as shown in FIG. 11, the exposed parts of the barrier metal film MBR are removed by the wet etching with chemical to thereby expose the surface of the passivation film PVF. At this time, in the barrier metal film MBR, parts of the barrier metal film MBR positioned directly under the copper redistribution line CPH are etched (side-etched) to cause the end surfaces of the barrier metal film MBR to recede inward (toward the opening PVH) from each side surface of the redistribution line CPH in some cases.

Then, the barrier film is formed at each side surface of the copper redistribution line CPH. Here, while manganese (Mn) and copper (Cu) particles are being deposited on the passivation film PVF by sputtering, the deposited manganese and copper particles are etched (re-sputtered off or sputtered) by manganese and copper particles flying and coming toward the semiconductor substrate SUB.

Figure 12:
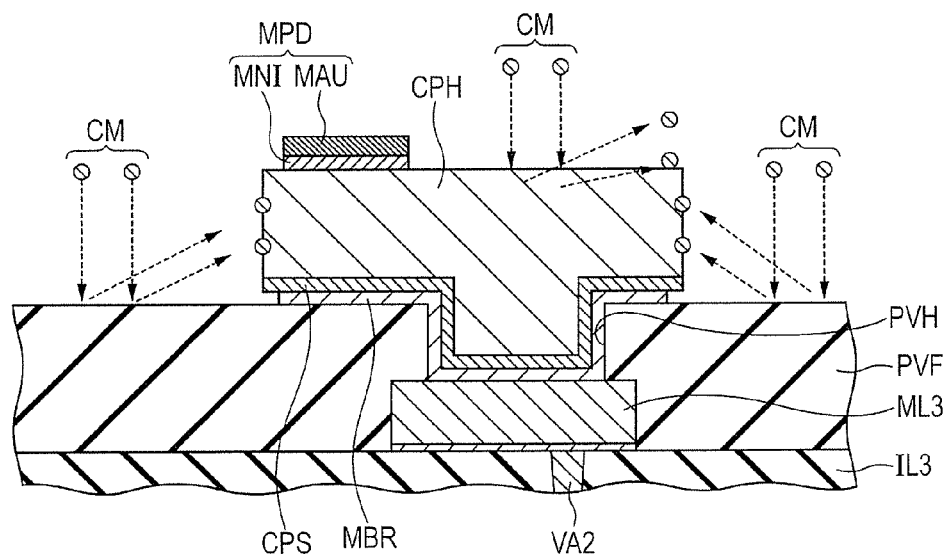
FIG. 12 is a partial cross-sectional view showing another step performed after the step shown in FIG. 11 in the first embodiment.

First, a predetermined bias is applied to the semiconductor substrate SUB. As shown in FIG. 12, copper and manganese particles (see the reference character CM) spattered by the spurring method from a target material are caused to fly and come toward the semiconductor substrate SUB (passivation film PVF) with the bias voltage applied thereto. The copper and manganese particles flying and coming are deposited mainly at the surface of the passivation film PVF and the upper surface of the copper redistribution line CPH.

In short, the copper and manganese particles deposited on the surface of the passivation film PVF and the like are re-sputtered and etched by other copper and manganese particles flying and coming toward the semiconductor substrate SUB. The copper and manganese particles re-sputtered are flown toward the side surface to be deposited on the side surfaces of the redistribution line CPH.

Figure 13:
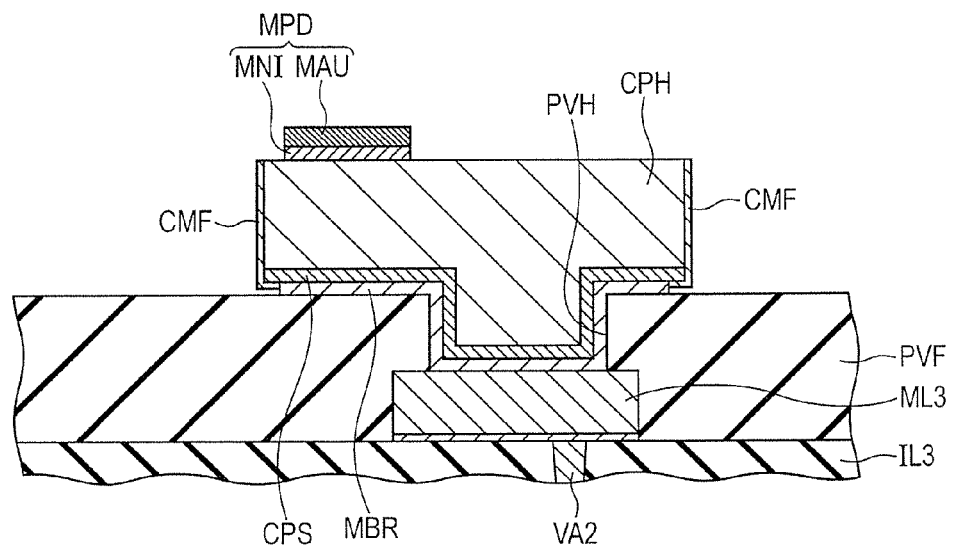
FIG. 13 is a partial cross-sectional view showing another step performed after the step shown in FIG. 12 in the first embodiment.

At this time, the bias voltage applied to the semiconductor substrate SUB is adjusted such that the amount of copper and manganese particles deposited on the passivation film PVF is substantially the same as that of the deposited copper and manganese particles etched by the re-sputtering. In this way, as shown in FIG. 13, the copper and manganese particles are deposited on the side surfaces of the copper redistribution line CPH without being deposited on the surface of the passivation film PVF and the upper surface of the copper redistribution line CPH, thereby forming an alloy film CMF including copper and manganese.

Figure 14:
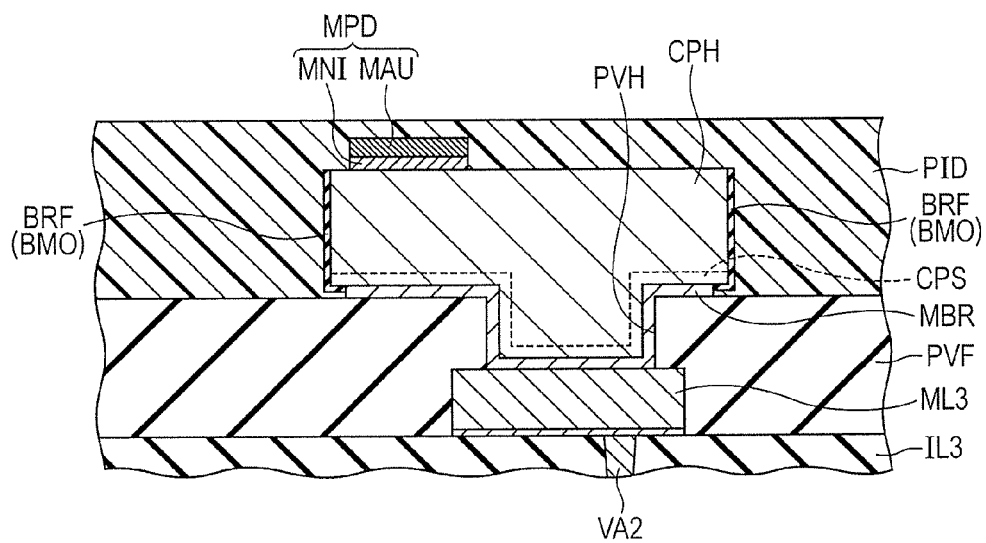
FIG. 14 is a partial cross-sectional view showing another step performed after the step shown in FIG. 13 in the first embodiment.

Then, the polyimide film PID (see FIG. 14) is formed to cover the copper redistribution line CPH and the like. Subsequently, a heat treatment is applied to burn the polyimide film. The heat treatment is performed, for example, at a temperature of approximately 300° C. At this time, in the alloy film CMF in contact with the polyimide film PID, as shown in FIG. 14, manganese (Mn) contained in the alloy film CMF is oxidized by moisture ($H_2O$) in the polyimide film, so that the manganese (Mn) oxide film BMO serving as the barrier film BRF is self-formed. The barrier film BRF is formed to be in contact with the end surfaces of the barrier metal film MBR located receded from each side surface of the copper retribution line CPH.

Figure 15:
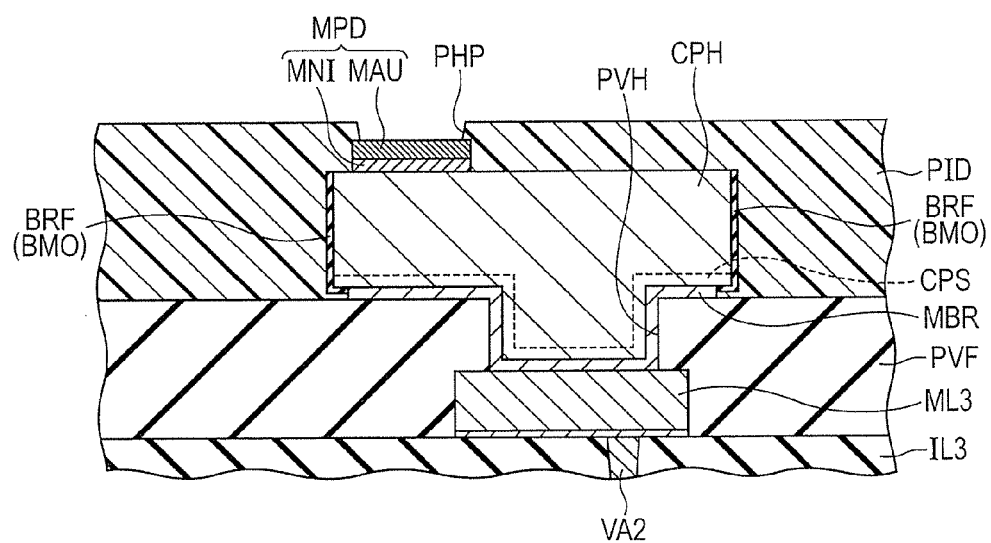
FIG. 15 is a partial cross-sectional view showing another step performed after the step shown in FIG. 14 in the first embodiment.

Then, as shown in FIG. 15, the opening PHP is formed in the polyimide film PID to expose the pad portion MPD (gold film MAU) by the photoengraving process and etching process. Then, after grinding or the like the backside of the semiconductor substrate (wafer), the wafer is diced. In the semiconductor device diced as the chip, the copper wire CPW (see FIG. 1) is bonded to the pad portion MPD, and then the semiconductor device (chip) is sealed (packaged). In this way, as shown in FIG. 1, manufacturing of the main parts of the semiconductor device are completed.

In the copper redistribution portion CRL of the semiconductor device in the first embodiment, the barrier film BRF containing the manganese oxide film BMO is formed at each side surface of the redistribution line CPH. Thus, the electric short-circuiting between the redistribution lines can be prevented. This will be described in detail below by comparison with a semiconductor device in a comparative example.

Regarding the semiconductor device in the comparative example, for simplifying the explanation, the same members as those of the semiconductor device in the first embodiment are denoted by the same reference numerals, and a description thereof will not be repeated unless it is required.

Figure 16:
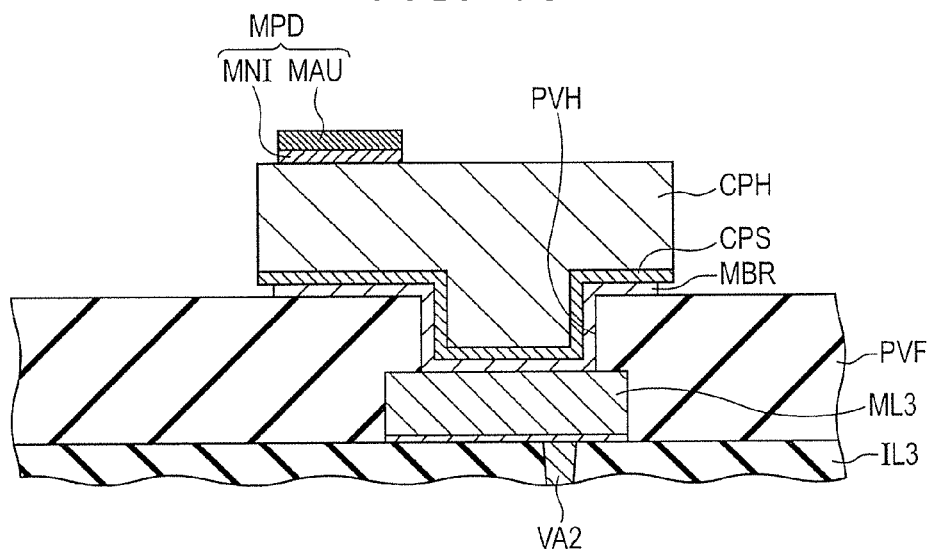
FIG. 16 is a partial cross-sectional view showing one step in a manufacturing method for a semiconductor device in a comparative example.
Figure 17:
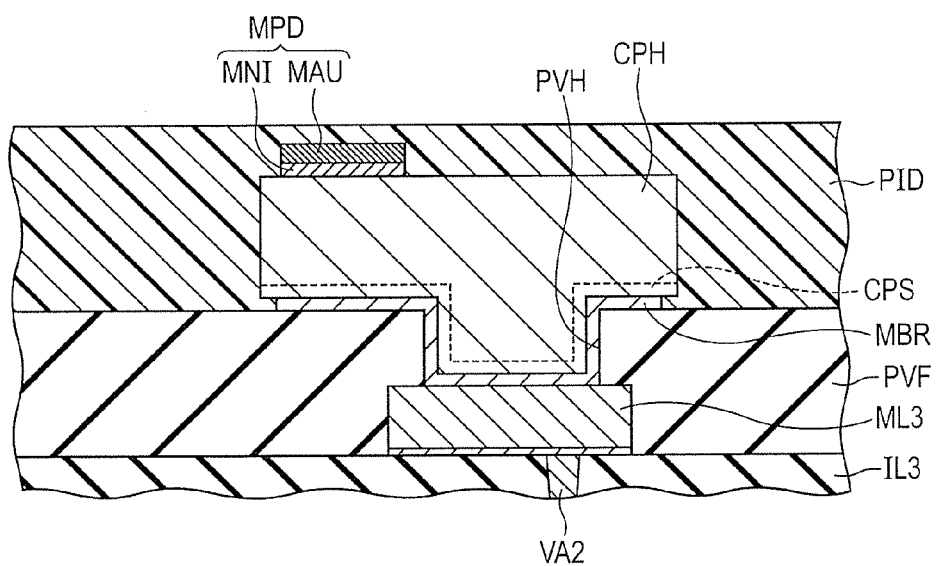
FIG. 17 is a partial cross-sectional view showing another step performed after the step shown in FIG. 16.

Through the same steps as those shown in FIGS. 2 to 10, as shown in FIG. 16, the pad portion MPD is formed at the upper surface of the redistribution line CPH. Next, as shown in FIG. 17, the polyimide film PID is formed to cover the redistribution line CPH and the pad portion MPD. Then, heat treatment is performed, for example, at a temperature of approximately 300° C. to burn the polyimide film. Thereafter, the manufacturing of the main parts of the semiconductor device in the comparative example is completed through the same steps as those shown in FIG. 15 and the like.

In the semiconductor device of the comparative example, the polyimide film PID is in contact with the surfaces of the copper redistribution line CPH including the side surfaces of the redistribution line CPH. The polyimide film PID contains moisture. Thus, the redistribution line CPH in contact with the polyimide film PID tends to promote ionization of copper.

Figure 18:
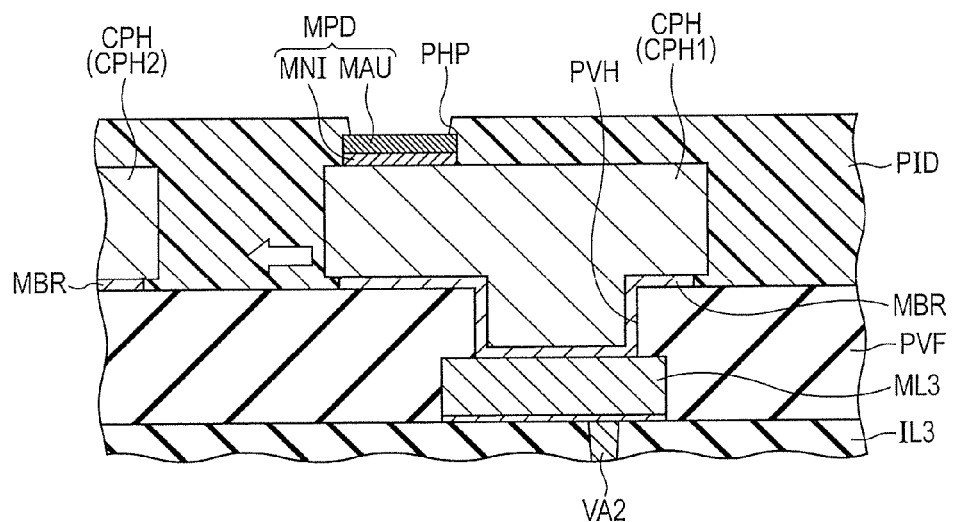
FIG. 18 is a partial cross-sectional view for explaining drawbacks of the semiconductor device in the comparative example.

In performing the environmental test (highly accelerated stress test: HAST) as the accelerated stress test for reliability on such a semiconductor device, while the semiconductor device is exposed to the environment at high temperature and high humidity, a relatively high voltage, for example, of about several tens of V to about 100 V is applied to the copper redistribution lines CPH. At this time, as shown in FIG. 18, for example, when a high voltage is applied to one redistribution line CPH1 of the adjacent redistribution lines CPH1 and CPH2, and the other redistribution line CPH2 is grounded, the ionized copper (copper ions) tends to easily move from one redistribution line CPH1 to the other redistribution line CPH2 (as indicated by a left-sided arrow).

An evaluation by the inventors have showed that in this case, particularly, copper ions tend to move from the side surface of one redistribution line CPH1 located at a relatively short distance from the other redistribution line CPH2 and opposed to the other redistribution line CPH2, along the interface between the passivation film PVF and the polyimide film PID. The inventors have further confirmed that copper precipitates between the one redistribution line CPH1 and the other redistribution line CPH2 due to the moved copper ions, causing the electric short-circuiting between the redistribution lines CPH1 and CPH2.

Compared to the comparative example, in the semiconductor device according to the embodiment, the alloy film CMF including manganese (Mn) and copper (Cu) is formed to cover the side surfaces of the redistribution line CPH before forming the polyimide film PID (see FIG. 13). Then, after forming the polyimide film PID, the heat treatment is applied to the polyimide film PID, whereby manganese (Mn) contained in the alloy film CMF reacts with moisture (oxygen) to form a manganese oxide film BMO. The barrier film BRF containing the manganese oxide film BMO is formed at the side surfaces of the redistribution line CPH (see FIG. 14). Formation of the barrier film BRF suppresses ionization of copper due to the presence of moisture contained in the polyimide film PID at the side surfaces of the redistribution line CPH.

Figure 19:
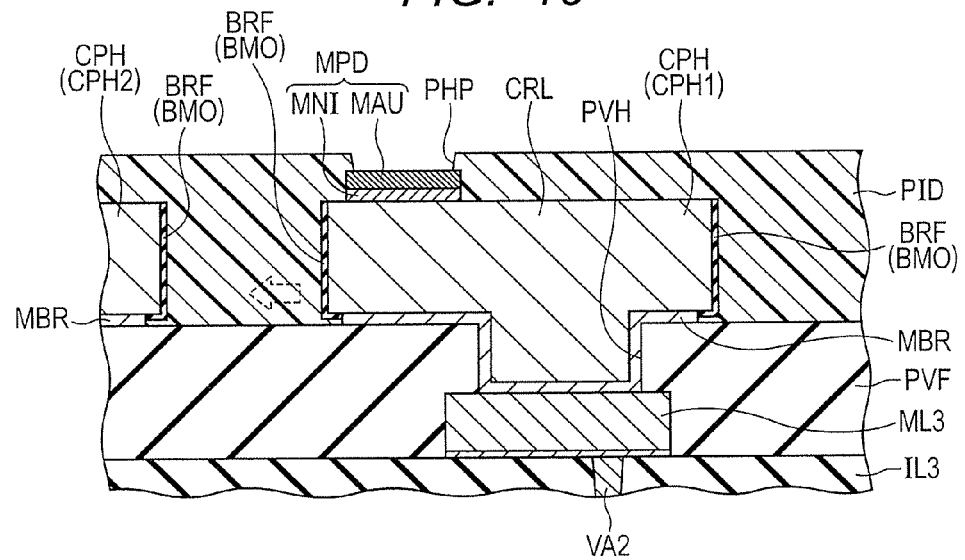
FIG. 19 is a partial cross-sectional view for explaining functional effects of the semiconductor device in the first embodiment.

The inventors have found that as shown in FIG. 19, this arrangement can suppress the movement of copper ions from the side surface of the one redistribution line CPH1 toward the other redistribution line CPH2 along the interface between the passivation film PVF and the polyimide film PID, even though the environment test is performed on the semiconductor device. As a result, the electric short-circuiting between the one redistribution line CPH1 and the other redistribution line CPH2 can be prevented.

In the semiconductor device of the one embodiment, the pad portion MPD is formed of the nickel film MNI and the gold film MAU, and the gold film MAU is stacked over the upper surface of the redistribution line CPH via the nickel film MNI. This structure can absorb impact generated when bonding the copper wire. Further, the alloy made of materials of the copper wire and the gold film MAU can be formed in bonding the copper wire. As a result, the copper wire can be surely bonded to the pad portion MPD (gold film MAU). It is noted that the nickel film MNI prevents gold of the gold film MAU from diffusing into the copper redistribution line CPH.

Figure 20:
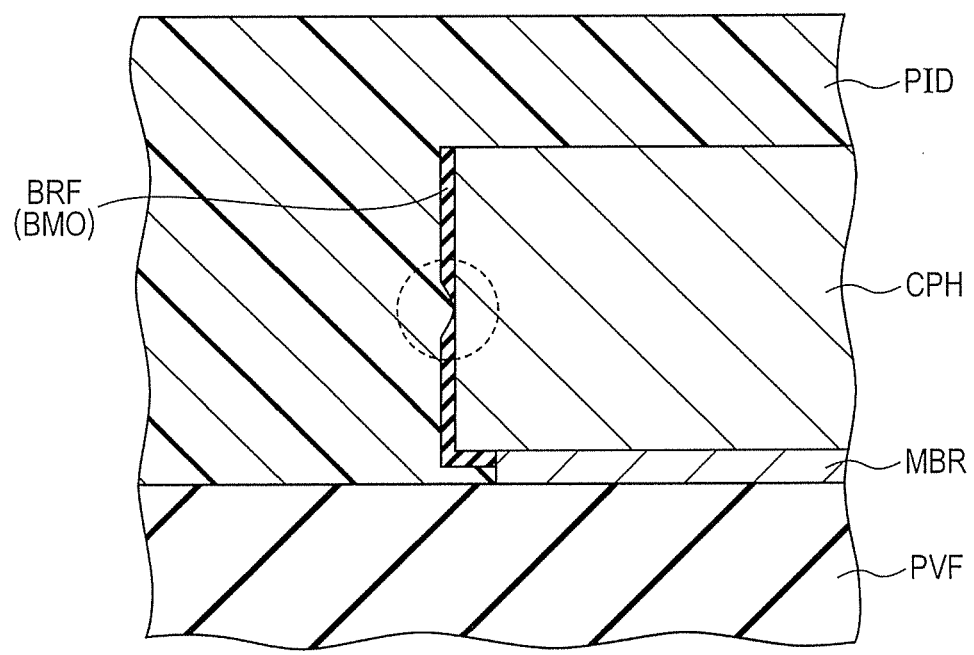
FIG. 20 is a partial cross-sectional view for explaining other functional effects of the semiconductor device in the first embodiment.
Figure 21:
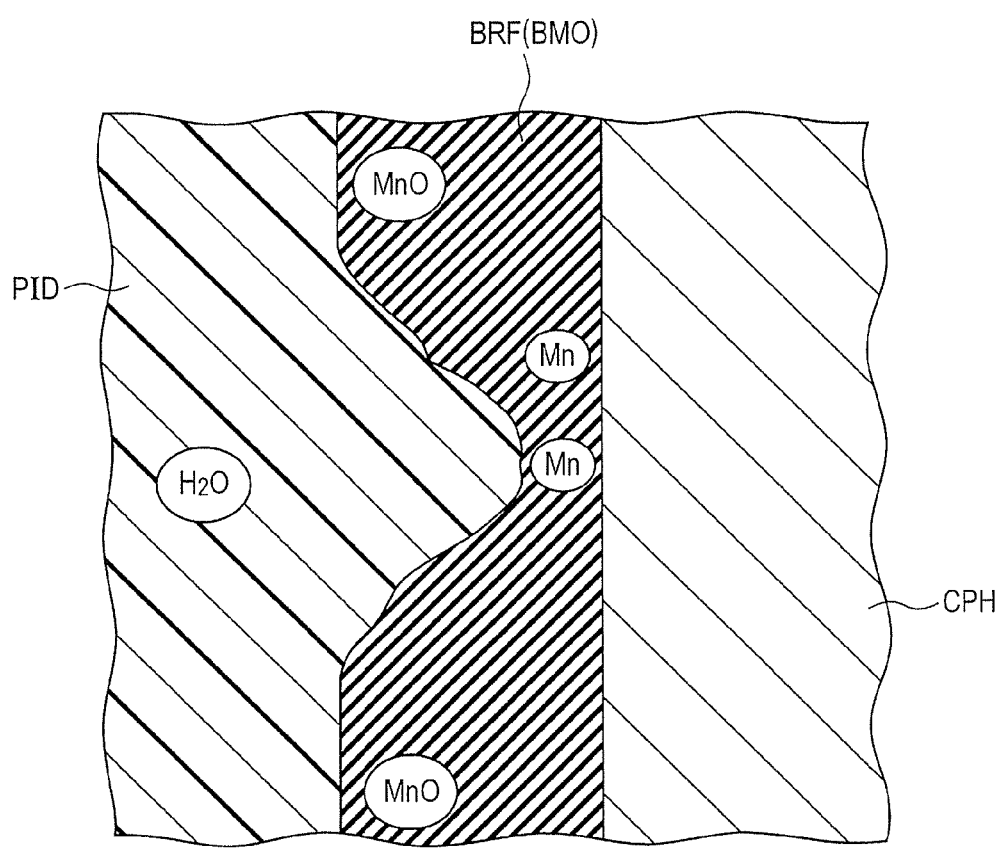
FIG. 21 is a first partial enlarged cross-sectional view for explaining other functional effects of the semiconductor device in the first embodiment.
Figure 22:
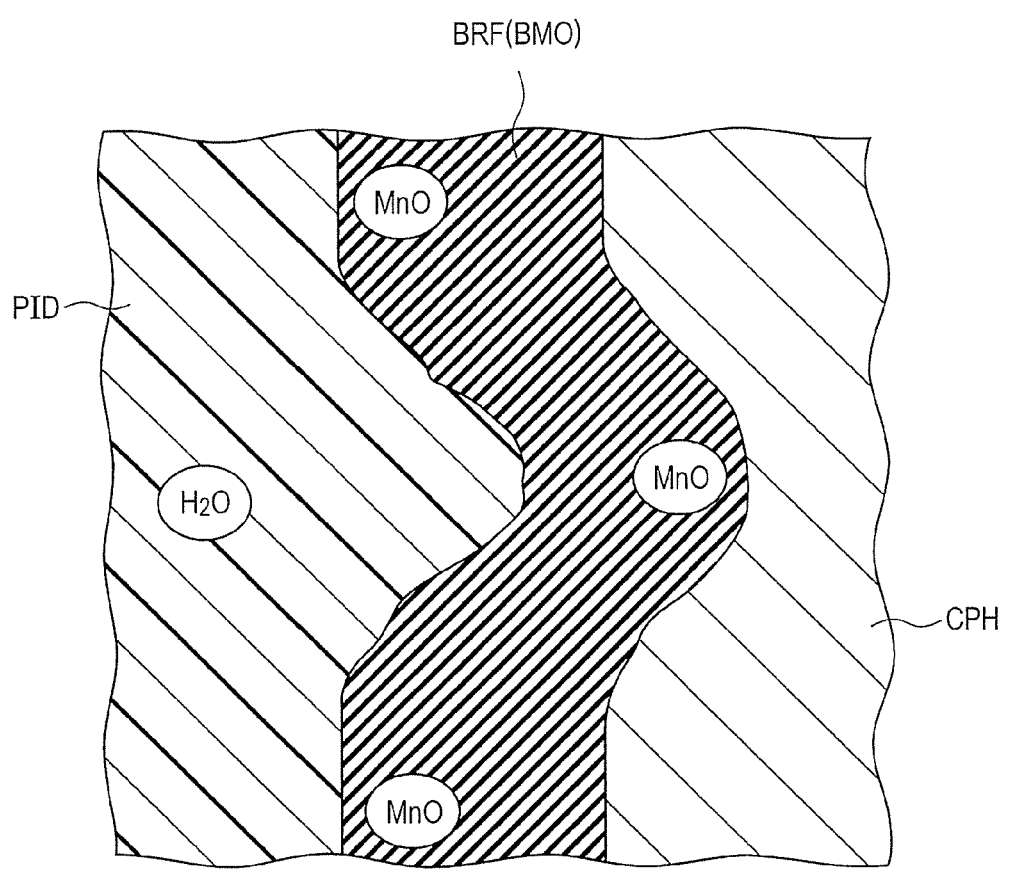
FIG. 22 is a second partial enlarged cross-sectional view for explaining other functional effects of the semiconductor device in the first embodiment.

When applying the environmental test, heat, or the like to the semiconductor device of the one embodiment, as shown in FIG. 20, the barrier film BRF is supposed to be broken (see a part enclosed by a dotted line). In such a case, copper of the redistribution line CPH might be exposed to the polyimide film PID containing moisture. At this time, manganese (Mn) remaining in the barrier film BRF reacts with the moisture to self-form manganese oxides (oxide film) as shown in FIG. 21. In this way, as a result of permitting the manganese oxides to be gradually self-formed, as shown in FIG. 22, the barrier film BRF can be self-restored.

Modified Examples

In the above-mentioned manufacturing method, when forming the alloy film of manganese and copper, the bias voltage to be applied to the semiconductor substrate SUB is adjusted such that the amount (deposition amount) of copper and manganese particles deposited on the passivation film PVF is substantially the same as that (etching amount) of the deposited copper and manganese particles etched by the re-sputtering. Here, a description will be given of the case of forming the alloy film by changing the deposition amount as well as the etching amount through adjustment of the bias.

Figure 23:
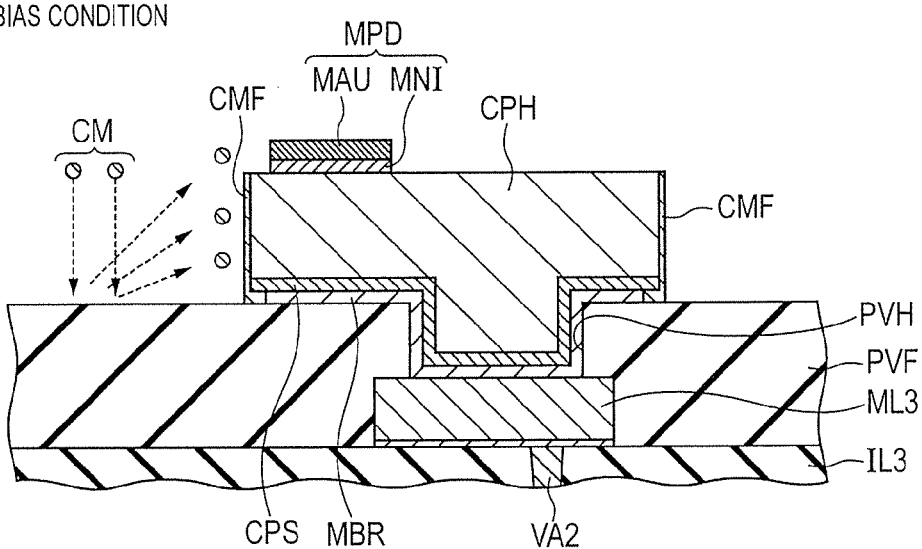
FIG. 23 is a diagram for explaining a manufacturing method for a semiconductor device in a modified example of the first embodiment.
Figure 23:
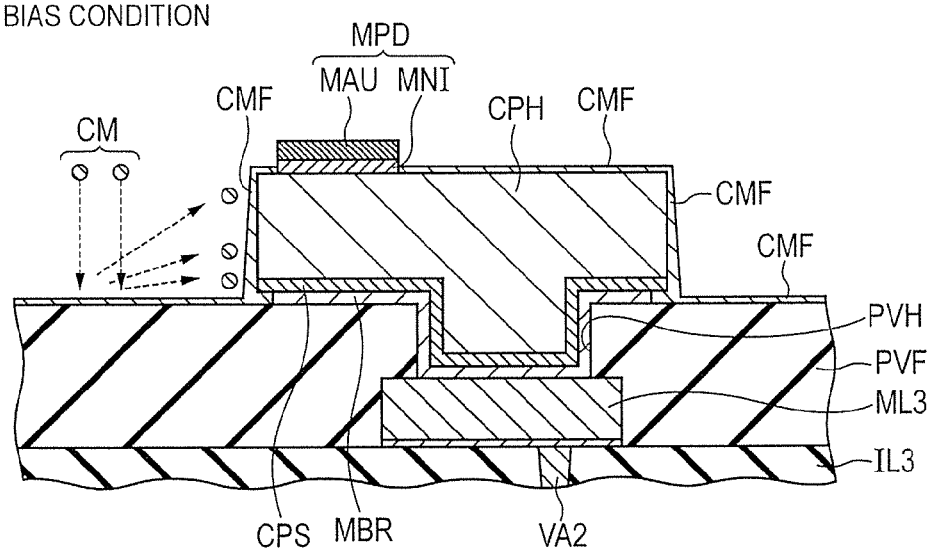

First, the findings regarding the bias and the forms of the alloy film, which have been obtained by the inventors, will be described below. As shown in FIG. 23, first, as to the energy of copper ions incident upon the semiconductor substrate, when the bias applied to the semiconductor substrate SUB is relatively high (on a high bias condition), the energy of copper ions becomes high, whereas when the bias is relatively low (on a low bias condition), the energy of copper ions becomes low.

As to the re-sputtering amount of the alloy deposited over the semiconductor substrate, on the high bias condition, the re-sputtering amount is much, whereas on the low bias condition, the re-sputtering amount is a little. Further, as to an angle of particles of the alloy re-sputtered (an angle formed by the surface of the passivation film with respect to the direction in which the alloy particles fly), on the high bias condition, the angles of particles are distributed from a low angle to a high angle, whereas on the low bias condition, the angles of particles are distributed mainly at low angles.

Thus, when forming the alloy film on the high bias condition, the alloy particles are uniformly deposited from the upper end to the lower end of the side surface of each redistribution line CPH to thereby form, at each side surface of the redistribution line CPH, the alloy film CMF having the substantially uniform thickness. The alloy particles over the upper surface of the passivation film PVF and the upper surface of the redistribution line CPH are re-sputtered, whereby the alloy film is barely deposited thereover (see the figure for the high bias condition in FIG. 23).

In contrast, when forming the alloy film on the low bias condition, the alloy particles are deposited concentrating on the lower end side of each side surface of the redistribution line CPH rather than the upper end side thereof, whereby the alloy film CMF is formed at the side surfaces of the redistribution line CPH in such a manner as to gradually increase its thickness from the upper end side to lower end side of the side surface. At the upper surface of the passivation film PVF and the upper surface of the redistribution line CPH, the alloy particles not re-sputtered are deposited as an alloy film CMF. (See the figure for the low bias condition in FIG. 23).

Figure 24:
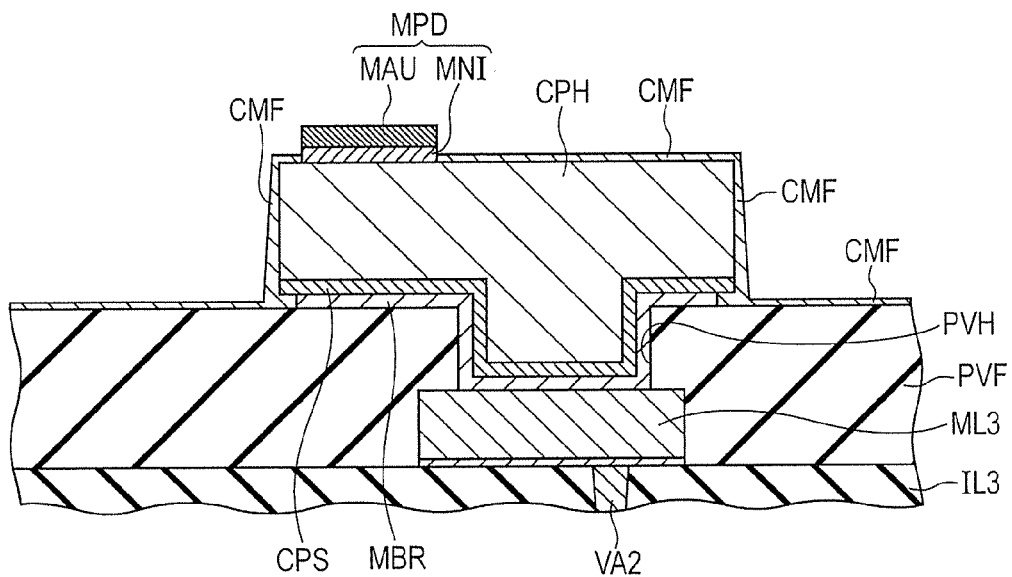
FIG. 24 is a partial cross-sectional view showing one step in the manufacturing method for the semiconductor device in the modified example of the first embodiment.

Based on the findings, in the semiconductor device of the modified example, the alloy film of copper and manganese is formed in two steps. First, after the same processes as those shown in FIGS. 2 to 11, in a first step, the alloy film is formed under the low bias condition. As shown in FIG. 24, the alloy film CMF is formed at each side of the redistribution line CPH to have its thickness gradually increased from the upper end side to lower end side of the side surface. The alloy film CMF is also deposited over the upper surface of the passivation film PVF and the upper surface of the redistribution line CPH.

Figure 25:
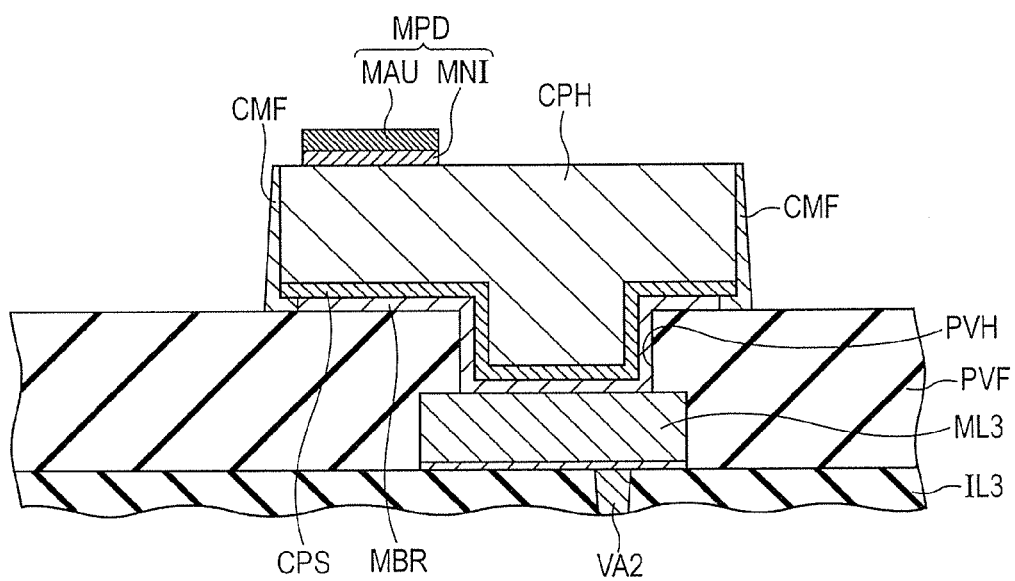
FIG. 25 is a partial cross-sectional view showing another step performed after the step shown in FIG. 24 in the first embodiment.

Then, in the following step, an alloy film is formed under the high bias condition. As shown in FIG. 25, the alloy film CMF deposited over the upper surface of the passivation film PVF and the upper surface of the redistribution line CPH are re-sputtered to disappear. Particles of the alloy of copper and manganese are deposited at the side surfaces of the redistribution line CPH across the upper end to lower end of each side surface.

Figure 26:
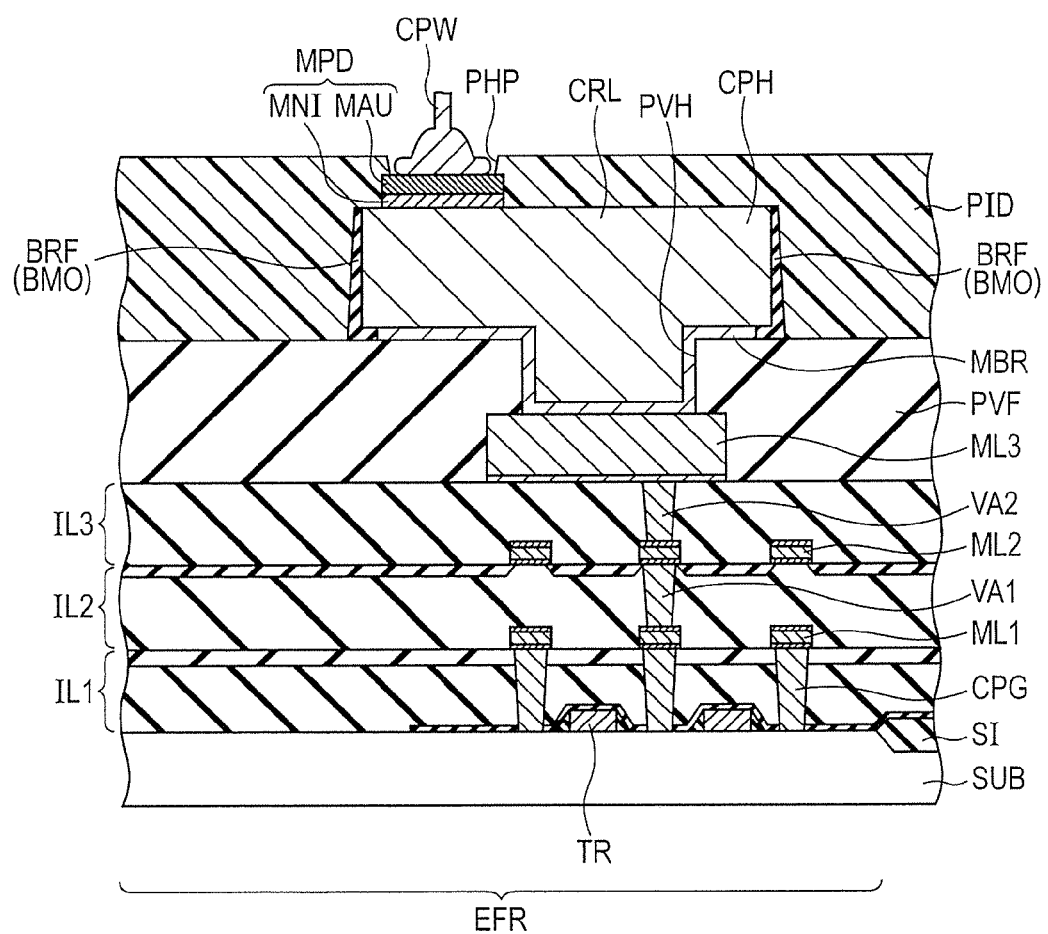
FIG. 26 is a partial cross-sectional view showing another step performed after the step shown in FIG. 25 in the first embodiment.

Through these two steps, the alloy film CMF is formed at the side surfaces of the redistribution line CPH to have its thickness gradually increased from the upper end side to lower end side of the side surface, while the alloy film CMF deposited over the upper surface of the passivation film PVF and the upper surface of the redistribution line CPH is removed. Then, in the same step as that shown in FIG. 14, the alloy film CMF is oxidized by the heat treatment to form the manganese oxide film BMO (see FIG. 26). In this way, the barrier film BRF is formed to have its thickness gradually increased from the upper end side to lower end side of the side surface of the redistribution line CPH (see FIG. 26). Then, after the same steps as those shown in FIGS. 15 to 17 and the like, as shown in FIG. 26, manufacturing of the main parts of the semiconductor device is completed.

As mentioned above, in the semiconductor device of the comparative example, copper ions tend to move from the side surface of one redistribution line CPH1 toward the other redistribution line along the interface between the passivation film PVF and the polyimide film PID (see FIG. 18).

Figure 27:
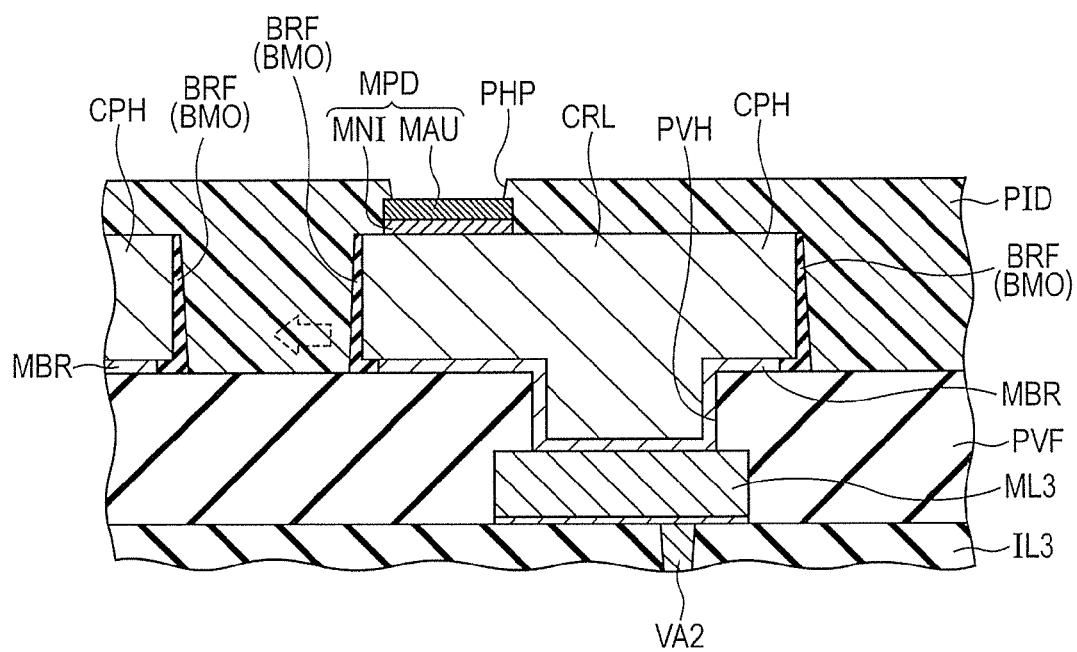
FIG. 27 is a partial cross-sectional view for explaining functional effects of the semiconductor device in the modified example of the first embodiment.

In the redistribution portion CRL of the semiconductor device in the modified example, the barrier film BRF is formed to have its thickness gradually increased from the upper end side to the lower end side of each side surface of the redistribution line CPH. As a result, a part of the barrier film BRF on a side where the interface between the passivation film PVF and the polyimide film PID is positioned is formed more thickly. Thus, as shown in FIG. 27 (indicated by a dotted arrow), the movement of copper ions that tend to move along the interface between the passivation film PVF and the polyimide film PID can be surely interrupted, so that the copper precipitates between the redistribution lines to thereby surely enable prevention of the electric short-circuiting between the redistribution lines.

Note that in the above-mentioned semiconductor device (including the modified examples), manganese (Mn) and copper (Cu) are applied to self-form the barrier film BRF as mentioned above. Additionally, a combination of titanium (Ti) and copper (Cu), or a combination of aluminum (Al) and copper (Cu) may be applied. Material for the barrier film is not limited to these metals, and any metal can be used as long as it is formed at the surface of the copper redistribution line and enables self-formation of an oxide (oxide film) thereof. In the use of titanium, a titanium (Ti) oxide film is formed. In the use of aluminum, an aluminum (Al) oxide film is formed. Even though any one of metals described above is used as metal for self-forming the barrier film BRF, the pad metal film of the pad portion MPD is formed of metal different from the metal used in the barrier film.

Second Embodiment

Hereinafter, a description will be given of an example of a semiconductor device including a copper redistribution line formed by the electrolytic plating method and a bonding pad formed by the sputtering method.

Figure 28:
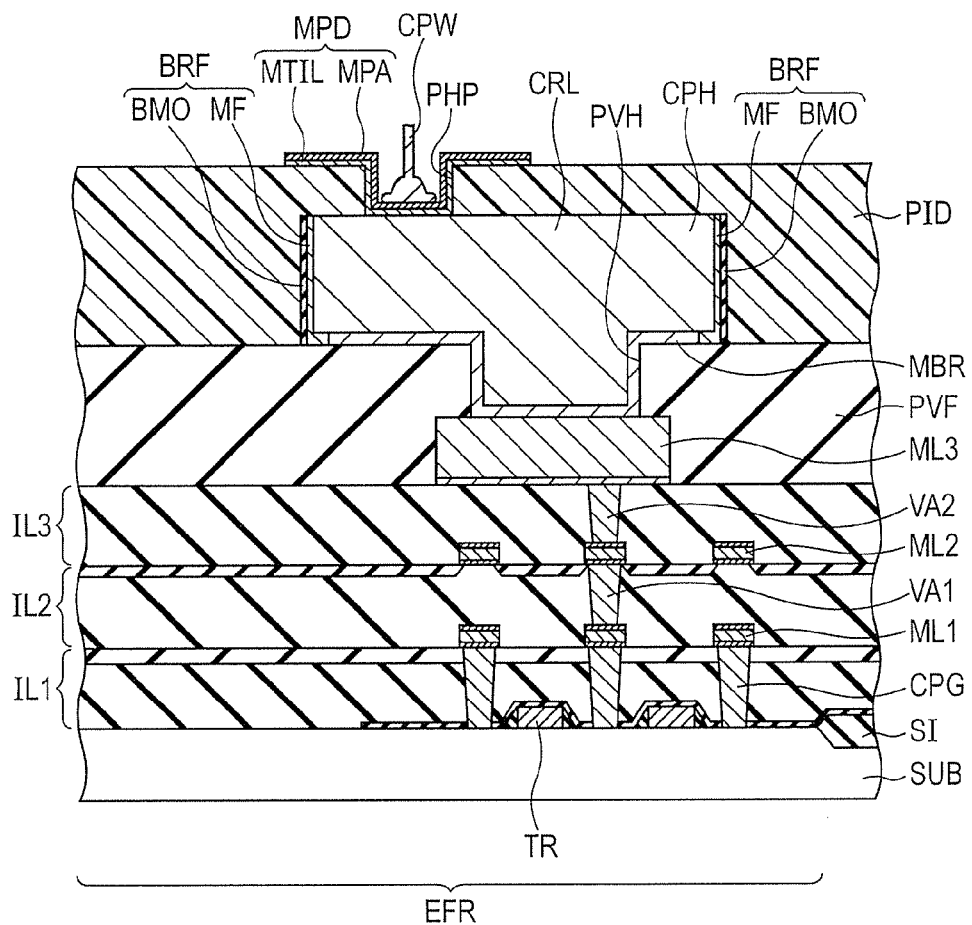
FIG. 28 is a cross-sectional view of a semiconductor device according to a second embodiment.

As shown in FIG. 28, a barrier film BRF is formed over each side surface of the copper redistribution line CPH. The barrier film BRF contains, for example, a manganese oxide film BMO and a manganese film MF. A redistribution portion CRL is formed of the copper redistribution line CPH, the barrier films BRF, and the barrier metal film MBR. The polyimide film PID is formed to cover the redistribution portion CRL. An opening PHP is formed in the polyimide film PID so as to communicate with the upper surface of the redistribution line CPH.

The pad portion MPD is formed in contact with the upper surface of the redistribution line CPH positioned at the bottom of the opening PHP and the polyimide film PID. The pad portion MPD is formed of a titanium film MTIL and a palladium film MPA. The palladium film MPA (pad metal film) is formed over the titanium film MTIL. The structure of other components except for that described above is substantially the same as that of the semiconductor device shown in FIG. 1. The same members are denoted by the same reference character, and thus a description thereof will be omitted and not repeated unless it is necessary.

Figure 29:
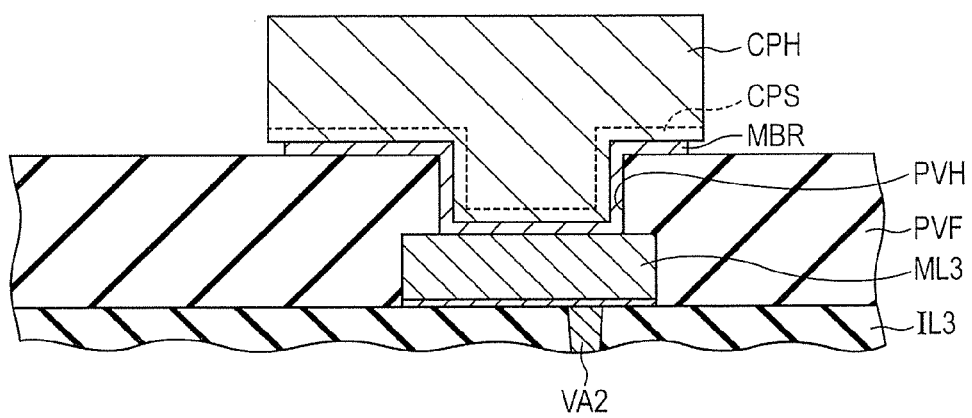
FIG. 29 is a partial cross-sectional view showing one step in a manufacturing method for the semiconductor device shown in FIG. 28 in the second embodiment.

Next, a method for manufacturing a semiconductor device in this embodiment will be described by way of example. After removing the photoresist pattern PR1 through the steps shown in FIGS. 2 to 7, like the step shown in FIG. 11, the wet etching process is performed with a chemical on each of the copper seed film and the barrier metal film. Thus, the exposed parts of the copper seed film and barrier metal film are removed to expose the surface of the passivation film PVF as shown in FIG. 29.

Figure 30:
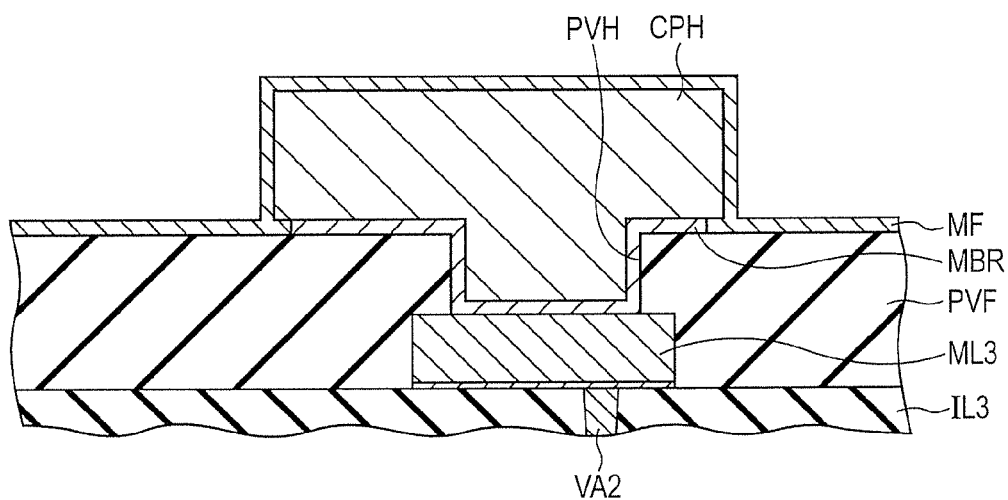
FIG. 30 is a partial cross-sectional view showing another step performed after the step shown in FIG. 29 in the second embodiment.
Figure 31:
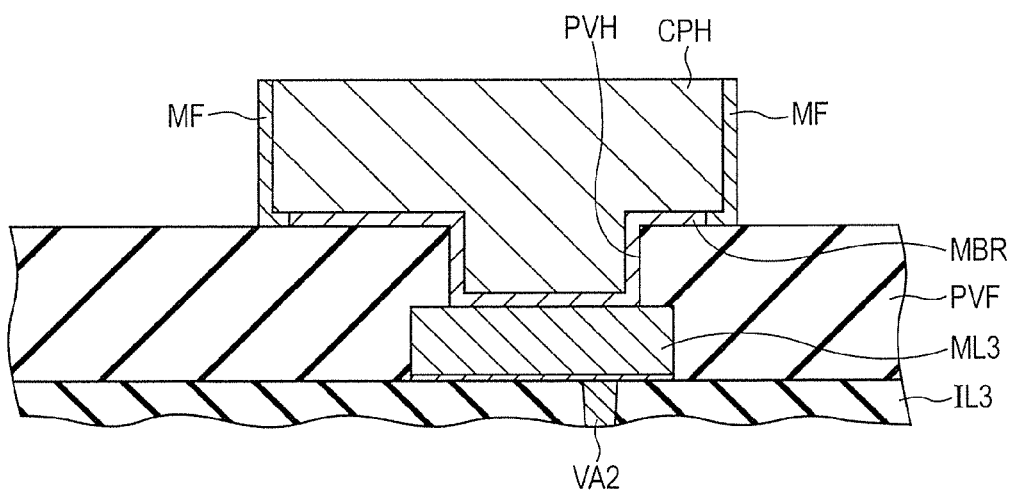
FIG. 31 is a partial cross-sectional view showing another step performed after the step shown in FIG. 30 in the second embodiment.

Then, as shown in FIG. 30, a manganese film MF is formed by sputtering to cover the copper redistribution line CPH. At this time, the manganese film MF is formed in contact with the end surfaces of the barrier metal film MBR located receded from the side surfaces of the copper retribution line CPH. Next, anisotropic etching is performed on the entire surface of the manganese film MF, whereby as shown in FIG. 31, parts of the manganese film MF located at the side surfaces of the redistribution line CPH are left, and parts of the manganese film MF respectively located over the upper surface of the passivation film PVF and the upper surface of the copper redistribution line CPH are removed.

Figure 32:
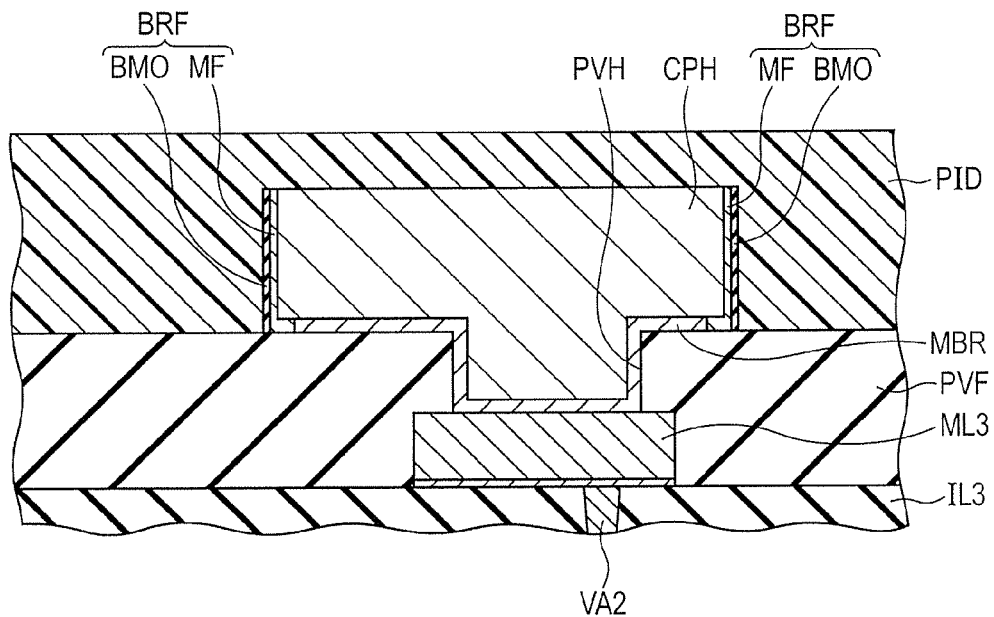
FIG. 32 is a partial cross-sectional view showing another step performed after the step shown in FIG. 31 in the second embodiment.

Then, as shown in FIG. 32, the polyimide film PID is formed to cover the copper redistribution line CPH and the like. Subsequently, the heat treatment is performed, for example, at a temperature of approximately 200° C., to burn the polyimide film PID. In the heat treatment, manganese (Mn) contained in the manganese film MF in contact with the polyimide film PID is oxidized by moisture ($H_2O$) of the polyimide film to form the manganese oxide film BMO.

At this time, a part of the manganese film MF from its surface in contact with the polyimide film PID up to a position in depth of approximately 2 nm to 5 nm is oxidized, and the other part thereof positioned deeper than the above-mentioned part remains as the manganese film without being oxidized. In this way, the barrier film BRF including the manganese oxide film BMO and the manganese film MF is formed.

Figure 33:
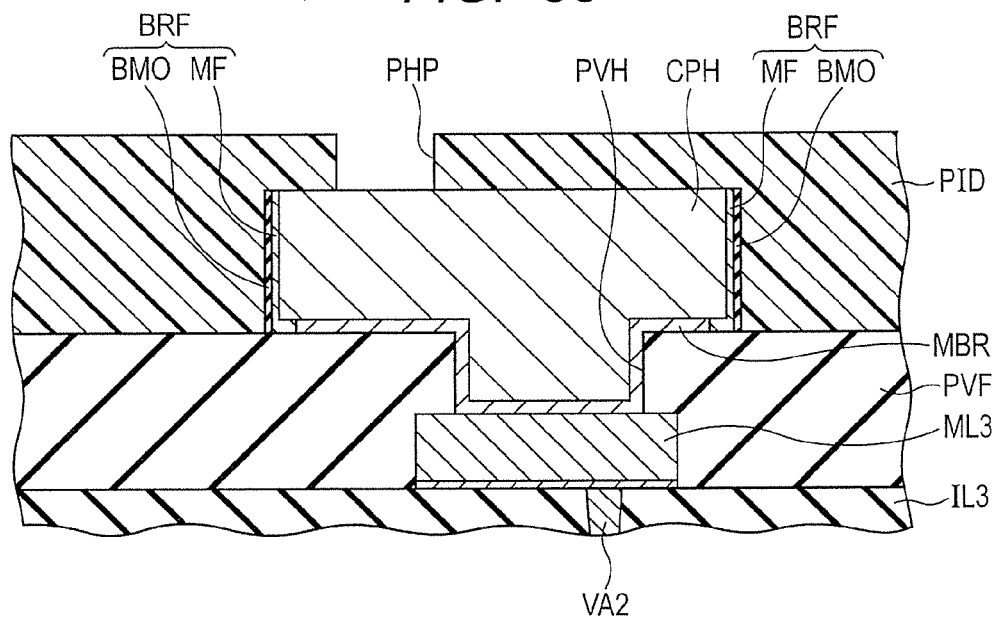
FIG. 33 is a partial cross-sectional view showing another step performed after the step shown in FIG. 32 in the second embodiment.
Figure 34:
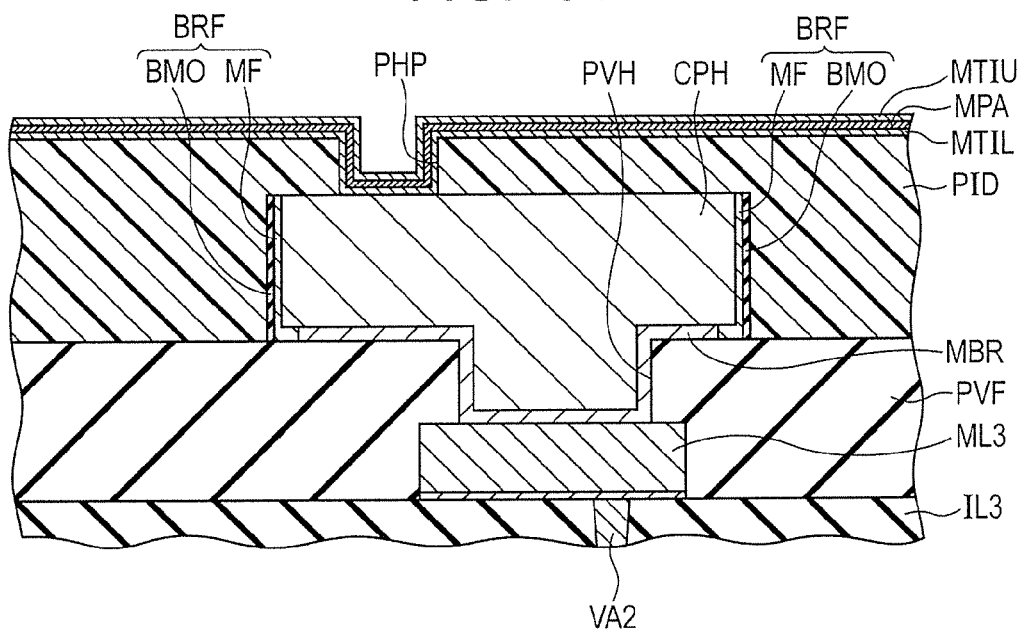
FIG. 34 is a partial cross-sectional view showing another step performed after the step shown in FIG. 33 in the second embodiment.

Then, as shown in FIG. 33, the opening PHP is formed in the polyimide film PID to expose the upper surface of the redistribution line CPH by a photoengraving process and an etching process. Thereafter, as shown in FIG. 34, the titanium film MTIL is formed by sputtering to be in contact with the upper surface of the exposed redistribution line CPH and the surface of the polyimide film PID. Subsequently, the palladium film MPA is formed by sputtering to be in contact with the titanium film MTIL. Further, a titanium film MTIU is formed by the sputtering to be in contact with the palladium film MPA.

Figure 35:
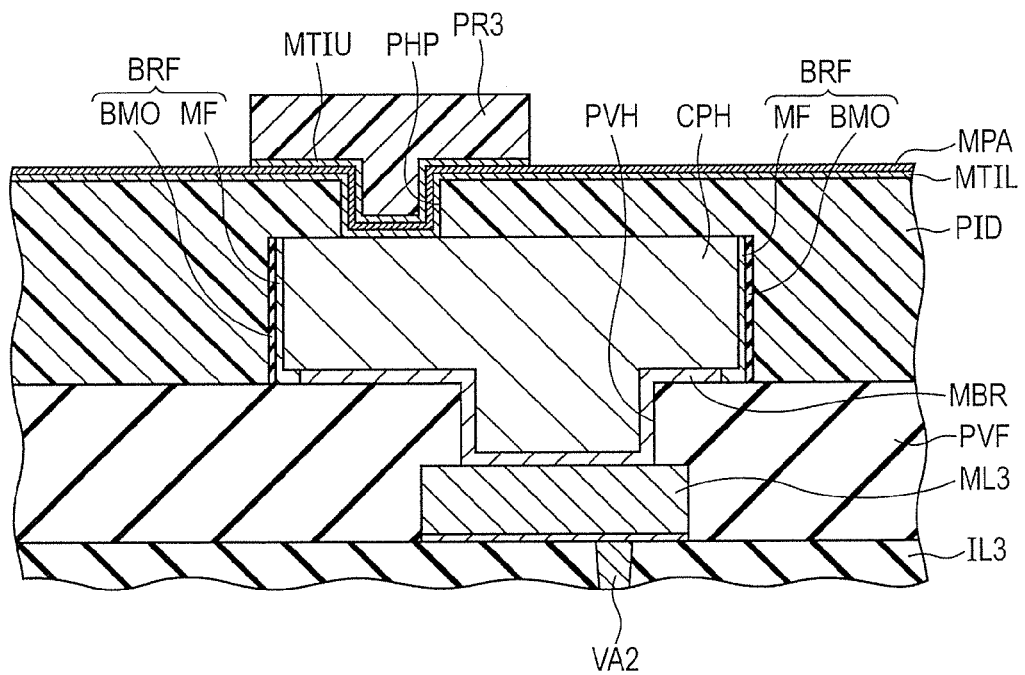
FIG. 35 is a partial cross-sectional view showing another step performed after the step shown in FIG. 34 in the second embodiment.

Thereafter, as shown in FIG. 35, a photoresist pattern PR3 for patterning the pad portions is formed by the photoengraving process. Then, the exposed part of the titanium film MTIU is etched using the photoresist pattern PR3 as an etching mask, whereby the part of the titanium film MTIU is removed to expose the palladium film MPA.

Figure 36:
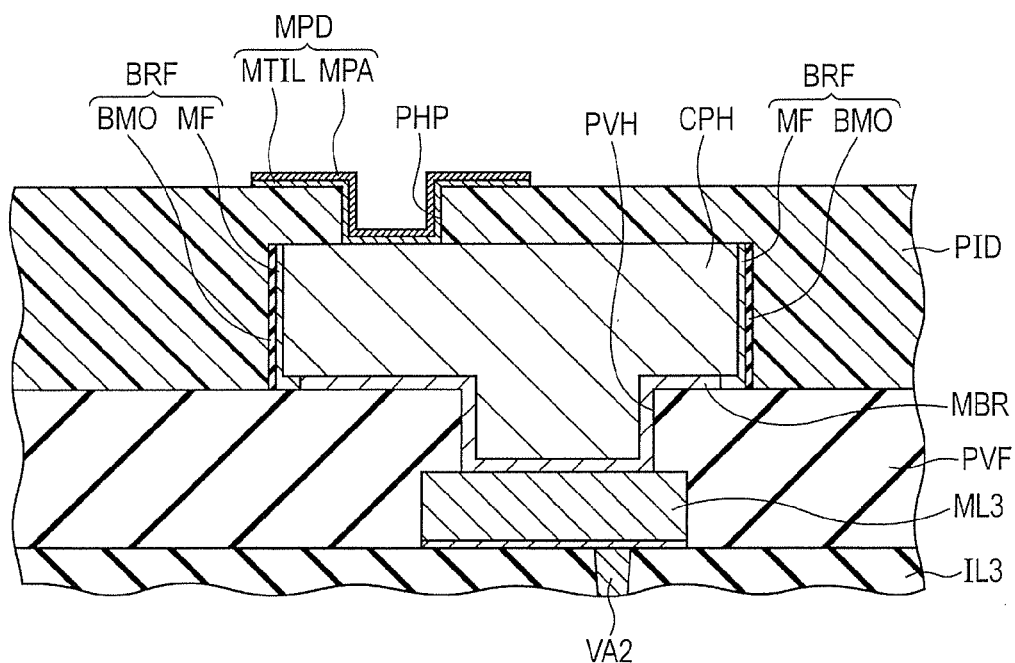
FIG. 36 is a partial cross-sectional view showing another step performed after the step shown in FIG. 35 in the second embodiment.

Then, after removing the photoresist pattern PR3, the wet etching with the chemical is performed on the substrate to thereby remove the exposed part of the palladium film MPA, causing a part of the titanium film MTIL to be exposed. Further, the wet etching with the chemical removes the exposed part of the titanium film MTIU and the exposed part of the titanium film MTIL. In this way, as shown in FIG. 36, the pad portion MPD is formed. Thereafter, the copper wire is boned to the pad portion MPD, and thus as shown in FIG. 28, the manufacturing of the main parts of the semiconductor device is completed.

In the redistribution portion CRL of the above-mentioned semiconductor device, the barrier film BRF including the manganese oxide film BMO and the manganese film MF is formed at each side surface of the redistribution line CPH. Thus, like the description about the first embodiment, the ionization of copper due to moisture contained in the polyimide film PID is suppressed at the side surfaces of the redistribution line CPH. Since the ionization of copper is suppressed, copper is prevented from precipitating between one redistribution line and the other redistribution line which are adjacent to each other, thereby enabling prevention of electric short-circuiting between the redistribution lines.

Here, in the above-mentioned semiconductor device, the manganese film formed by sputtering to cover the redistribution line CPH is oxidized to form the manganese oxide film. At this time, a part of the manganese film MF from its surface to a position in a predetermined depth is oxidized, while the other parts positioned deeper than the above-mentioned part remain as the manganese film without being oxidized.

Thus, the barrier film BRF including the manganese oxide film MO and the manganese film MF can be made thicker as the barrier film BRF, compared to a barrier BRF produced by oxidizing the alloy film CMF deposited at the side surface of the redistribution line CPH by the re-sputtering. Even though the barrier film BRF is broken, the remaining manganese film is oxidized to surely enable self-formation of the manganese oxide (film), thereby enhancing the function of self-restoring the barrier film BRF.

In the semiconductor device according to the one embodiment, the pad portion MPD is formed of the titanium film MTIL and the palladium film MPA. The palladium film MPA is laminated over the upper surface of the redistribution line CPH via the titanium film MTIL. Thus, the impact generated upon bonding the copper wire can be absorbed, and an alloy can be formed from the copper wire and the palladium film MPA when bonding the copper wire. As a result, the copper wire can be surely bonded to the pad portion MPD (palladium film MPA). Note that the titanium film MTIL inhibits diffusion of palladium included in the palladium film MPA into the copper redistribution line CPH.

Note that in the above-mentioned semiconductor device, the manganese (Mn) film is applied to self-form the barrier film BRF as mentioned above. In addition, a titanium (Ti) film, an aluminum (Al) film, or the like may be applied. Material for the barrier film BRF is not limited to these metals, and any metal can be used as long as it is formed at the surface of the copper redistribution line and can self-form an oxide (oxide film). In using a titanium film, a titanium (Ti) oxide film is formed. In using an aluminum film, an aluminum (Al) oxide film is formed. Even though any one of metals described above is used as metal for self-forming the barrier film BRF, the pad metal film of the pad portion MPD is formed of metal different from that used in the barrier film. Although the polyimide film PID is used as the resin film in the description above, the resin film is not limited thereto.

Note that various semiconductor devices described in the respective embodiments (including the modified examples) can be combined as needed.

The present invention made by the inventors has been specifically described on the basis of the embodiments. It is apparent that the present invention is not limited to the embodiments described above, and that various modifications and changes can be made to the embodiments without departing from the spirit and scope of the invention.

What is claimed is:

1. A semiconductor device, comprising:
  a semiconductor substrate having a main surface;
  a multi-layer wiring that includes wirings respectively formed over the main surface of the semiconductor substrate and having different heights from the main surface;
  a passivation film formed to cover an uppermost-layer wiring disposed in a highest position from the main surface in the multi-layer wiring, the passivation film having an opening communicating with the uppermost-layer wiring;
  a redistribution portion including a redistribution line formed to be in contact with a part of the uppermost-layer wiring positioned in the opening, the redistribution line having a side surface and an upper surface;
  a pad portion formed to be in contact with the upper surface of the redistribution line; and
  a resin film formed to cover the redistribution portion,
  wherein the redistribution portion includes a barrier film formed to be in contact with the side surface of the redistribution line, the barrier film containing a metal oxide film, and
  wherein the pad portion includes a pad metal film made of material different from that for the barrier film.

2. The semiconductor device according to claim 1,
  wherein the metal oxide film of the barrier film contains any one selected from the group comprised of a manganese (Mn) oxide film, a titanium (Ti) oxide film, and an aluminum (Al) oxide film.

3. The semiconductor device according to claim 1,
  wherein in the redistribution portion, a thickness of a part of the barrier film formed at a lower end side of the side surface of the redistribution line is larger than a thickness of a part of the barrier film formed at an upper end side of the side surface.

4. The semiconductor device according to claim 1,
  wherein the barrier film includes any one of laminated films selected from the group comprised of a laminated film of a manganese (Mn) film and a manganese (Mn) oxide film as the metal oxide film, a laminated film of a titanium (Ti) film and a titanium (Ti) oxide film as the metal oxide film, and a laminated film of an aluminum (Al) film and an aluminum (Al) oxide film as the metal oxide film.

5. The semiconductor device according to claim 1,
  wherein the redistribution portion includes a first barrier metal film formed to be in contact with a part of the uppermost-layer wiring positioned in the opening,
  wherein the redistribution line is formed to be in contact with the first barrier metal film with the first barrier metal film intervening between the uppermost-layer wiring and the redistribution line, and
  wherein the barrier film is formed to be in contact with an end surface of the first barrier metal film.

6. The semiconductor device according to claim 5,
  wherein the first barrier metal film includes at least one of a chromium (Cr) film and a first titanium (Ti) film.

7. The semiconductor device according to claim 1,
  wherein the pad portion includes a second barrier metal film formed to be in contact with the upper surface of the redistribution line, and
  wherein the pad metal film is formed to be in contact with the second barrier metal film with the second barrier metal film intervening between the redistribution line and the pad metal film.

8. The semiconductor device according to claim 7,
  wherein the second barrier metal film is a nickel (Ni) film, and
  wherein the pad metal film is a gold (Au) film.

9. The semiconductor device according to claim 7,
  wherein the second barrier metal film is a second titanium (Ti) film, and
  wherein the pad metal film is a palladium (Pd) film.

10. The semiconductor device according to claim 1,
  wherein the redistribution line is formed of a copper film,
  wherein the uppermost-layer wiring is formed of an aluminum film, and
  wherein a thickness of the redistribution line is larger than that of the uppermost-layer wiring.

11. A method for manufacturing a semiconductor device, comprising the steps of:
  forming a multi-layer wiring over a main surface of a semiconductor substrate, which has the main surface, the multi-layer wiring including wirings having different heights from the main surface;
  forming a passivation film to cover an uppermost-layer wiring disposed in a highest position from the main surface in the multi-layer wiring;
  forming, in the passivation film, an opening for exposing the uppermost-layer wiring;
  forming a redistribution portion to be in contact with the uppermost-layer wiring exposed from the opening, the redistribution portion including a redistribution line with a side surface and an upper surface; and
  forming a pad portion to be in contact with the upper surface of the redistribution line,
  wherein the step of forming the redistribution portion comprises the steps of:
  forming a metal film containing at least a first metal at the side surface of the redistribution line except for a surface of the passivation film and the upper surface of the redistribution line; and
  forming a barrier film that contains a first metal oxide film formed through oxidation of the first metal by applying heat treatment to the metal film, and
  wherein the step of forming the pad portion comprises the step of:
  forming a pad metal film from material different from that for the barrier film.

12. The method for manufacturing a semiconductor device according to claim 11,
  wherein the step of forming the metal film comprises the step of:
  depositing, as the metal film, the first metal and a second metal different from the first metal over the side surface of the redistribution line by etching while depositing the first metal and the second metal at the surface of the passivation film, and
  wherein the metal film is deposited under a condition in which an amount of deposition of the first metal and the second metal at the surface of the passivation film is substantially the same as an amount of etching of the first metal and second metal deposited.

13. The method for manufacturing a semiconductor device according to claim 12,
  wherein in the step of forming the metal film, any one of metals selected from the group comprised of manganese (Mn), titanium (Ti), and aluminum (Al) is used as the first metal, and
  wherein copper (Cu) is used as the second metal.

14. The method for manufacturing a semiconductor device according to claim 11, wherein the step of forming the metal film comprises the step of:

depositing, as the metal film, the first metal and a second metal different from the first metal over the side surface of the redistribution line by etching while depositing the first metal and the second metal at the surface of the passivation film, and wherein the metal film is deposited under a condition in which an amount of deposition of the first metal and the second metal at the surface of the passivation film differs from an amount of etching of the first metal and second metal deposited.

15. The method for manufacturing a semiconductor device according to claim 11, wherein the step of forming the metal film comprises the steps of:

forming a first metal film from the first metal to cover the passivation film and the redistribution line; and removing parts of the first metal film respectively positioned over the upper surface of the redistribution line and the surface of the passivation film while leaving a part of the first metal film positioned at the side surface of the redistribution line by etching the first metal film.

16. The method for manufacturing a semiconductor device according to claim 15, wherein in the step of forming the metal film, any one selected from the group comprised of a manganese (Mn) film, a titanium (Ti) film, and an aluminum (Al) film is used as the first metal film.

17. The method for manufacturing a semiconductor device according to claim 11, further comprising the steps of:

forming a resin film to cover the redistribution portion and the passivation film; and applying heat treatment to the resin film, wherein the step of applying the heat treatment to the resin film includes a step of applying the heat treatment to the metal film.

* * * * *